US008719658B2

(12) United States Patent
Cui et al.

(10) Patent No.: US 8,719,658 B2
(45) Date of Patent: May 6, 2014

(54) ACCESSING MEMORY DURING PARALLEL TURBO DECODING

(75) Inventors: Zhiqiang Cui, San Diego, CA (US); Iwen Yao, San Diego, CA (US); Qiang Huang, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 770 days.

(21) Appl. No.: 12/878,934

(22) Filed: Sep. 9, 2010

(65) Prior Publication Data
US 2012/0066566 A1    Mar. 15, 2012

(51) Int. Cl.
G11C 29/00 (2006.01)
H03M 13/03 (2006.01)

(52) U.S. Cl.
USPC ........... 714/763; 714/791; 714/792; 714/794; 375/262; 375/265; 375/341

(58) Field of Classification Search
None
See application file for complete search history.

(56) References Cited

U.S. PATENT DOCUMENTS

| | | | |
|---|---|---|---|
| 6,392,572 B1 | 5/2002 | Shiu et al. | |
| 6,594,792 B1 * | 7/2003 | Hladik et al. | 714/755 |
| 6,996,767 B2 | 2/2006 | Chang et al. | |
| 7,058,874 B2 * | 6/2006 | Zhou | 714/756 |
| 7,979,772 B2 * | 7/2011 | Oz et al. | 714/752 |
| 7,984,368 B2 * | 7/2011 | Pisek et al. | 714/794 |
| 8,171,384 B2 * | 5/2012 | Drory et al. | 714/796 |
| 8,255,759 B2 * | 8/2012 | Pan et al. | 714/752 |
| 8,291,302 B2 * | 10/2012 | Haiut | 714/780 |
| 8,358,713 B2 * | 1/2013 | Govindarajulu | 375/265 |
| 8,495,455 B1 * | 7/2013 | Zhang et al. | 714/755 |
| 2007/0101231 A1 | 5/2007 | Kutz et al. | |
| 2010/0077265 A1 | 3/2010 | Wei et al. | |
| 2010/0268918 A1 * | 10/2010 | Priewasser et al. | 712/208 |

FOREIGN PATENT DOCUMENTS

WO    WO-03098811 A2    11/2003
WO    WO-2004028004 A2    4/2004

OTHER PUBLICATIONS

Asghar et al. Journal of Signal Processing Systems, Jul. 2009. "Memory Conflict Analysis and Implementation of a Re-configurable interleaver Architecture Supporting Unified Parallel Turbo Decoding".
Yoon et al. IEEE Communications Letters, Jul. 2002. vol. 6, No. 7, pp. 288-290. "A Parallel MAP Algorithm for Low Latency Turbo Decoding".
Asghar et al. Hindawi Journal of Computer Systems, Networks, and Communications, Oct. 2009. "Multimode Flex-Interleaver Core for Baseband Processor Platform".
Sun et al. Proceedings of the 2008 International Conference on Application-Specific Systems, Architectures and Processors, 2008, pp. 209-214. "Configurable and Scalable High Throughput Turbo Decoder Architecture for Multiple 4G Wireless Standards".

(Continued)

Primary Examiner — Albert Decady
Assistant Examiner — Justin R Knapp
(74) Attorney, Agent, or Firm — Ramin Mobarhan

(57) ABSTRACT

A method for accessing extrinsic information in a turbo decoder is disclosed. Operation phases for Forward State Metric Calculators (FSMCs) and Reverse State Metric Calculators (RSMCs) in multiple maximum a posteriori probability (MAP) decoders are misaligned differently based on whether a current half iteration is even or odd. First extrinsic information is read from a memory into the FSMCs and RSMCs using the misaligned operation phases. Second extrinsic information is determined using the MAP decoders. Each row of the second extrinsic information is stored to a different bank in the memory using the misaligned operation phases.

48 Claims, 17 Drawing Sheets

(56) References Cited

OTHER PUBLICATIONS

Asghar et al. 3rd International Symposium on Wireless Pervasive Computing, Jul. 2008, pp. 768-772. "Dual Standard Re-configurabie Hardware Interleaver for Turbo Decoding".

Sun et al. 2001 IEEE International Symposium on Information Theory, Aug. 2002, pp. 297. "Turbo-like Codes Based on RSC Code Decomposition".

3GPP TS 25.212 V9.2.0 (Mar. 2010), 3rd Generation Partnership Project;Technical Specification Group Radio Access Network; Multiplexing and channel coding (FDD) (Release 9), pp. 1-108.

Espresso (LTE) UE Hardware HDD, 80-H5921-1 Rev A, Apr. 2008.

Modem Core: High-Speed Turbo Decoder High Level Design, 80-V7864-20 Rev C, Jan. 2007.

Giulietti, A., et al., "Parallel Turbo Coding Interleavers: Avoiding Collisions in Accesses to Storage Elements," Electronics Letters, IEE Stevenage, GB, vol. 38, No. 5, Feb. 28, 2002, pp. 232-234, XP006018151, ISSN: 0013-5194.

International Search Report and Written Opinion—PCT/US2011/051117—ISA/EPO—Jan. 6, 2012.

Schurgers C., et al., "Memory Optimization of MAP Turbo Decoder Algorithms", IEEE Transactions on Very Large Scale Integration (VLSI) Systems, IEEE Service Center, Piscataway, NJ, US, vol. 9, No. 2, Apr. 1, 2001, XP011063161, ISSN: 1063-8210.

* cited by examiner

US 8,719,658 B2

ACCESSING MEMORY DURING PARALLEL TURBO DECODING

TECHNICAL FIELD

The present disclosure relates generally to electronic devices for communication systems. More specifically, the present disclosure relates to accessing memory during parallel turbo decoding.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

Wireless communication systems are widely deployed to provide various types of communication content such as voice, video, data and so on. These systems may be multiple-access systems capable of supporting simultaneous communication of multiple wireless communication devices with one or more base stations.

To increase throughput in a wireless communication network, a wireless communication device may use various encoding and decoding techniques. These techniques may access memory within the device in order to store and retrieve data. However, memory access schemes may cause conflicts that disrupt or degrade communications. Therefore, benefits may be realized by systems and methods for accessing memory during parallel turbo decoding.

SUMMARY

A method for accessing extrinsic information in a turbo decoder is disclosed. Operation phases for Forward State Metric Calculators (FSMCs) and Reverse State Metric Calculators (RSMCs) in multiple maximum a posteriori probability (MAP) decoders are misaligned differently based on whether a current half iteration is even or odd. First extrinsic information is read from a memory into the FSMCs and RSMCs using the misaligned operation phases. Second extrinsic information is determined using the MAP decoders. Each row of the second extrinsic information is stored to a different bank in the memory using the misaligned operation phases.

In one configuration, the reading may include reading row by row if the current iteration is a sequential mode even half iteration. The reading may also include reading column by column if the current iteration is an interleaved mode odd half iteration. The reading may include placing information in a read queue before it is read by the FSMCs and RSMCs and the storing may include storing each row in a write queue before it is stored in the memory banks.

The determining second extrinsic information may include determining a first forward state metric (FSM) for a first portion of the first extrinsic information. This may include traversing the first portion of a received code block from left to right to determine a first FSM, determining a log-likelihood ratio based on the first FSM and determining two a priori probability (APP) values for the first FSM. The determining second extrinsic information may also include determining a first reverse state metric (RSM) for the first portion of the extrinsic information. This may include traversing the first portion of the received code block in reverse to determine the first RSM, determining a log-likelihood ratio based on the first RSM and determining two APP values for the first RSM.

A second FSM and RSM may be determined for a second portion of the first extrinsic information. A third FSM and RSM may be determined for a third portion of the first extrinsic information. A fourth FSM and RSM may be determined for a fourth portion of the first extrinsic information. If the current iteration is a sequential mode even half iteration, the misaligning may include creating a first phase for the FSMCs and a second phase for the RSMCs. If the current iteration is an interleaved mode odd half iteration, the misaligning may include creating a first phase for the first FSM, a second phase for the first RSM, a third phase for the second FSM, a fourth phase for the second RSM, a fifth phase for the third FSM, a sixth phase for the third RSM, a seventh phase for the fourth FSM and an eighth phase for the fourth RSM. The turbo decoder may operate in a 3rd generation wireless network.

Furthermore, a code block may be divided into segments. If the current iteration is a sequential mode even half iteration, sequential addresses may be determined for memory access. If the current iteration is a first sequential mode even half iteration, intermediate boundary values may be determined for columns at boundaries of each segment and stored in an array of registers. If the current iteration is an interleaved mode odd half iteration, interleaved addresses may be determined based on intermediate values. The second extrinsic information may be read using the sequential addresses during sequential half iterations or using the interleaved addresses during interleaved half iterations.

An integrated circuit for accessing extrinsic information in a turbo decoder is also disclosed. The integrated circuit includes Forward State Metric Calculators (FSMCs) and Reverse State Metric Calculators (RSMCs) in multiple maximum a posteriori probability (MAP) decoders with misaligned operation phases based on whether a current half iteration is even or odd. The integrated circuit also includes read queues configured to read first extrinsic information from a memory into the FSMCs and RSMCs using the misaligned operation phases. The integrated circuit also includes MAP decoders configured to determine second extrinsic information. The integrated circuit also includes write queues configured to store each row of the second extrinsic information to a different bank of the memory using the misaligned operation phases.

An apparatus for accessing extrinsic information in a turbo decoder is also disclosed. The apparatus includes a processor and memory in electronic communication with the processor. Executable instructions are stored in the memory. The instructions are executable to misalign operation phases differently for Forward State Metric Calculators (FSMCs) and Reverse State Metric Calculators (RSMCs) in multiple maximum a posteriori probability (MAP) decoders based on whether a current half iteration is even or odd. The instructions are also executable to read first extrinsic information from a memory into the FSMCs and RSMCs using the misaligned operation phases. The instructions are also executable to determine second extrinsic information using the MAP decoders. The instructions are also executable to store each row of the second extrinsic information to a different bank of the memory using the misaligned operation phases.

An apparatus for accessing extrinsic information in a turbo decoder is also disclosed. The apparatus includes means for misaligning operation phases differently for Forward State Metric Calculators (FSMCs) and Reverse State Metric Calculators (RSMCs) in multiple maximum a posteriori probability (MAP) decoders based on whether a current half iteration is even or odd. The apparatus also includes means for reading first extrinsic information from a memory into the FSMCs and RSMCs using the misaligned operation phases. The apparatus also includes means for determining second extrinsic information using the MAP decoders. The apparatus also includes means for storing each row of the second extrinsic information to a different bank of the memory using the misaligned operation phases.

DETAILED DESCRIPTION

Based on recent development of each mobile communication standard and the increase of data rates in wireless networks, the throughput of turbo decoders has become more important to maintain high quality communication. The turbo decoder is a relatively computation intensive hardware engine in a demodulation backend.

One possible way to perform turbo decoding is to use a multi-core turbo decoder. However, this may consume high amounts of power within a modem and use a large silicon area for VLSI implementation. Therefore, it may be desirable to enable a single-core, high-speed, low-power turbo decoder in order to conserve resources and still support the large bandwidths of decoding throughput used in wireless networks, e.g., tens or hundreds of Mbits/sec. The term "single-core" refers to a turbo decoder that allocates all its computation resource for decoding only one code block in each decoding process. Some of the benefits of single-core turbo decoders are hardware utilization efficiency and that no arbitration logic may be needed for scheduling multiple code block streams.

One configuration for high throughput single-core turbo decoding is a parallel turbo decoder. However, one challenge when implementing a parallel turbo decoder is determining how to handle the memory conflicts when parallel maximum a posteriori probability (MAP) decoders are working concurrently.

The present systems and methods may utilize a turbo decoder's interleaver characteristics when using different wireless communication standards. So-called third generation (3G) standards may use block turbo interleavers and may not accommodate parallel decoding easily, i.e., Wideband Code Division Multiple Access (WCDMA) and Code Division Multiple Access (CDMA). Memory access may be performed for 3G communication by using minimal memory banking, decoding stream misalignment and applying small first in, first out queues (FIFOs). In contrast, the turbo interleaver in so-called fourth generation (4G) standards may be designed using a modular function in which parallel decoding may be implemented through proper memory banking. In other words, some of the potential memory conflicts in 3G parallel turbo decoding may not exist in 4G parallel turbo decoding, i.e., Long Term Evolution (LTE) and Worldwide Interoperability for Microwave Access (WiMAX). State propagation may also be used in the parallel turbo decoder for fast convergence of the iterative decoding, thus resulting in better performance than the sliding window approach.

Figure 1:
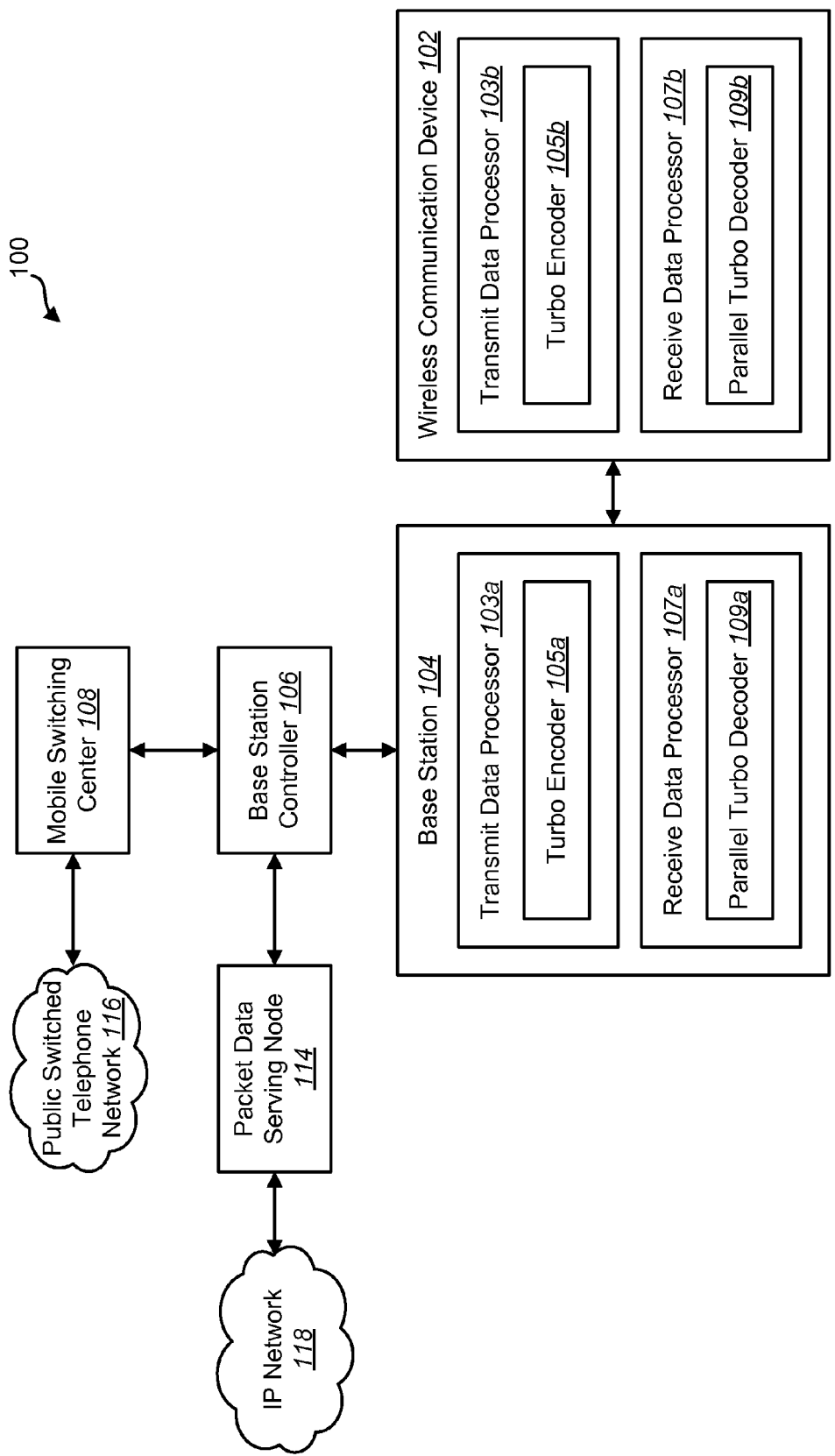
FIG. 1 is a block diagram illustrating a system for accessing memory during turbo decoding.

FIG. 1 is a block diagram illustrating a system 100 for accessing memory during turbo decoding. The system 100 may include a wireless communication device 102 that communicates with a base station 104. The base station 104 may communicate with a base station controller (BSC) 106 (also referred to as a radio network controller or packet control function). The base station controller 106 may communicate with a mobile switching center (MSC) 108, a packet data serving node (PDSN) 114 or internetworking function (IWF), a public switched telephone network (PSTN) 116 (typically a telephone company) and an Internet Protocol (IP) network 118, e.g., typically the Internet. The mobile switching center 108 may be responsible for managing the communication between the wireless communication device 102 and the public switched telephone network 116 while the packet data serving node 114 may be responsible for routing packets between the wireless communication device 102 and the IP network 118.

As used herein, the term "wireless communication device" refers to an electronic device that may be used for voice and/or data communication over a wireless communication system. Examples of wireless communication devices include cellular phones, personal digital assistants (PDAs), handheld devices, wireless modems, laptop computers, personal computers, etc. A wireless communication device may alternatively be referred to as an access terminal, a mobile terminal, a mobile station, a remote station, a user terminal, a terminal, a subscriber unit, a subscriber station, a mobile device, a wireless device, user equipment (UE) or some other similar terminology. The term "base station" refers to a wireless communication station that is installed at a fixed location and used to communicate with wireless communication devices. A base station may alternatively be referred to as an access point, a Node B, an evolved Node B or some other similar terminology.

The wireless communication device 102 and the base station 104 may include a transmit data processor 103a-b and a receive data processor 107a-b. The transmit data processors 103*a-b* may include a turbo encoder 105*a-b* that encodes a payload for transmission across a wireless channel. The receive data processors 107*a-b* may include a parallel turbo decoder 109*a-b* that recursively estimates the transmitted payload based on received data. The parallel turbo decoders 109*a-b* may utilize a relatively large amount of memory accesses for extrinsic information. The parallel turbo decoders 109*a-b* may access the memory by using minimal memory banking, decoding stream misalignment and applying small FIFO queues.

Figure 2:
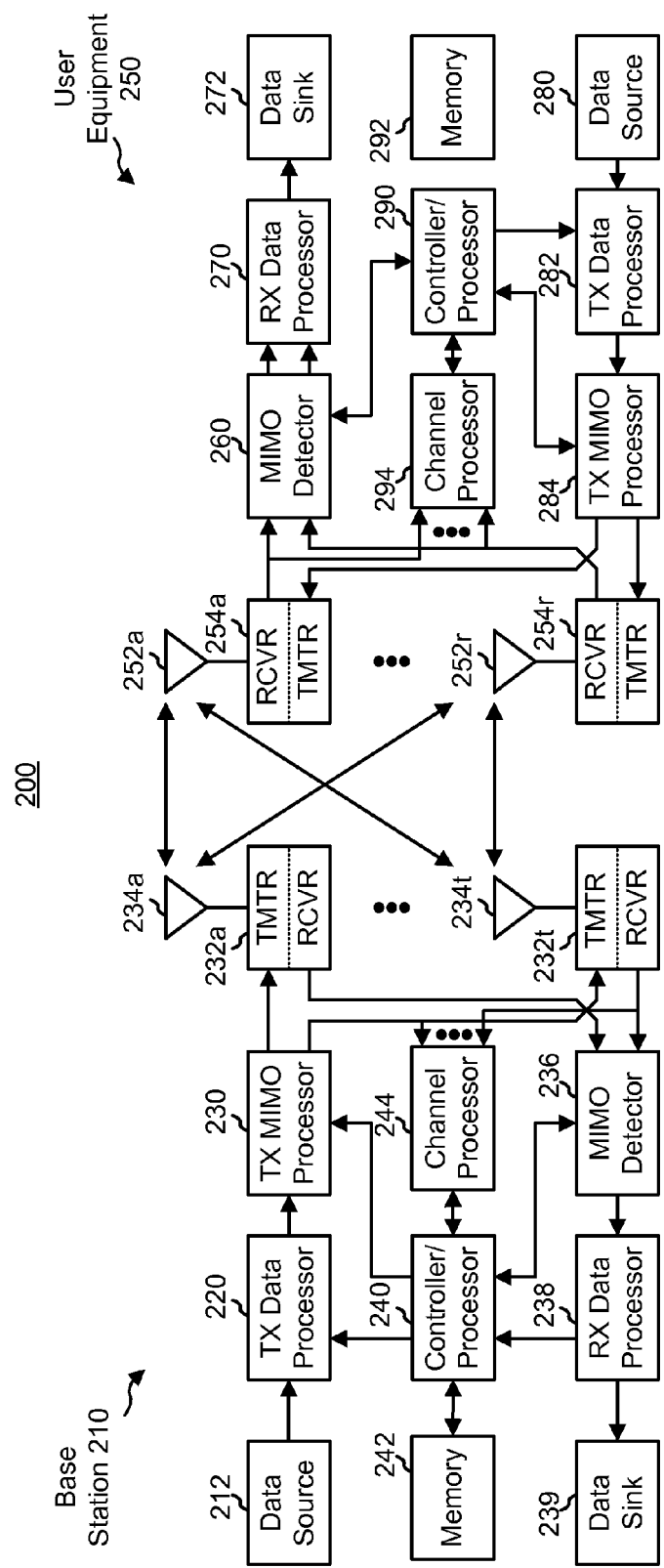
FIG. 2 is a block diagram illustrating a base station and a user equipment (UE) in a wireless communication system.

FIG. 2 is a block diagram illustrating a base station 210 and a user equipment (UE) 250 in a wireless communication system 200. The base station 210 may be equipped with multiple (T) antennas 234*a-t* that may be used for data transmission and reception. The UE 250 may be equipped with multiple (R) antennas 252*a-r* that may be used for data transmission and reception. Each antenna may be a physical antenna or an antenna array.

At the base station 210, a transmit (TX) data processor 220 may receive traffic data from a data source 212, process (e.g., format, encode, interleave and symbol map) the traffic data based on a transport format and provide data symbols. As used herein, a data symbol is a symbol for data, a pilot symbol is a symbol for pilot and a symbol is typically a complex value. The data symbols and pilot symbols may be modulation symbols from a modulation scheme such as Phase Shift Keying (PSK) or Quadrature Amplitude Modulation (QAM). Pilot is data that is known a priori by both a transmitter and a receiver. A transport format may indicate a code block size, a modulation and coding scheme, etc. A transport format may also be referred to as a rate, a packet format, etc.

A TX MIMO processor 230 may multiplex the data symbols with pilot symbols and may perform direct multiple input multiple output (MIMO) mapping, precoding/beamforming, etc. A symbol may be sent from one antenna for direct MIMO mapping or from multiple antennas for precoding/beamforming. The TX MIMO processor 230 may provide T output symbol streams to T transmitters (TMTR) 232*a-t*. Each transmitter 232*a-t* may process its output symbol stream (e.g., for OFDM, SC-EDM, CDMA, etc.) to obtain an output chip stream. Each transmitter 232*a-t* may further condition (e.g., convert to analog, filter, amplify and upconvert) its output chip stream and generate a downlink signal. T downlink signals from the transmitters 232*a-t* may be transmitted from the T antennas 234*a-t*, respectively.

At the UE 250, R antennas 252*a-r* may receive the downlink signals, and each antenna 252*a-r* may provide a received signal to a respective receiver (RCVR) 254*a-r*. Each receiver 254*a-r* may process (e.g., filter, amplify, downconvert and digitize) received signal to obtain samples and may further process the samples (e.g., for OFDM, SC-FDM, CDMA, etc.) to obtain received symbols. The receivers 254*a-r* may provide received data symbols to a MIMO detector 260 and provide received pilot symbols to a channel processor 294. The channel processor 294 may estimate the downlink channel response based on the received pilot symbols and provide channel estimates to the MIMO detector 260. The MIMO detector 260 may perform MIMO detection on the received data symbols with the channel estimates and provide data symbol estimates. A receive (RX) data processor 270 may further process (e.g., symbol demap, deinterleave and decode) the data symbol estimates and provide decoded data to a data sink 272. In general, the processing by the MIMO detector 260 and the RX data processor 270 may be complementary to the processing by the TX MIMO processor 230 and the TX data processor 220 at the base station 210.

The UE 250 may evaluate the channel conditions and send feedback information to base station 210. The feedback information may comprise a MIMO rank indicating the number of data streams or layers to send in parallel, channel quality indicators (CQIs) and/or other information. The feedback information and traffic data from a data source 280 may be processed by a TX data processor 282, multiplexed with pilot symbols and processed by a TX MIMO processor 284, and further processed by the transmitters 254*a-r* to generate R uplink signals, which may be transmitted via the antennas 252*a-r*.

At the base station 210, the uplink signals may be received by the T antennas 234*a-t*, processed by the receivers 232*a-t*, detected by a MIMO detector 236 and further processed by an RX data processor 238 to recover the feedback information and traffic data sent by the UE 250. The data recovered by the RX data processor 238 may be provided to a data sink 239. The controller/processor 240 may control the data transmission to the UE 250 based on the feedback information. A channel processor 244 may estimate the uplink channel response based on the received pilot symbols and provides channel estimates, which may be used for MIMO processing or detection.

The controllers/processors 240, 290 may direct the operation at the base station 210 and the UE 250, respectively. The memories 242, 292 may store data and program codes for the base station 210 and the UE 250, respectively.

Figure 3:
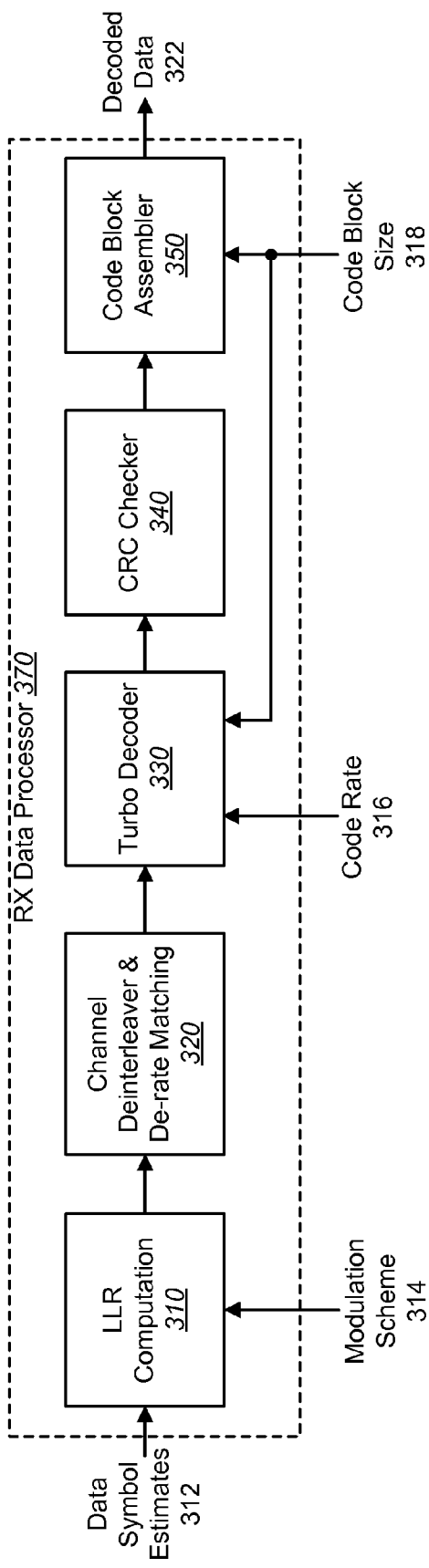
FIG. 3 is a block diagram illustrating a receive (RX) data processor.

FIG. 3 is a block diagram illustrating a receive (RX) data processor 370. The RX data processor 370 may correspond to the RX data processors 270, 238 illustrated in FIG. 2. The RX data processor 370 may include a log-likelihood ratio (LLR) computation unit 310 that receives data symbol estimates 312 from a MIMO detector 260 and computes the LLRs of the code bits for each data symbol estimate 312. This may include using a selected modulation scheme 314. A data symbol may be obtained by mapping B code bits to a complex value in a signal constellation. B LLRs may be computed for the B code bits of the data symbol based on a corresponding data symbol estimate 312. The LLR for each code bit may indicate the likelihood of the code bit being zero ('0') or one ('1') given the data symbol estimate 312 for that code bit. A channel deinterleaver & de-rate matching unit 320 may perform deinterleaving and de-rate matching on the LLRs from the LLR computation unit 310 in a manner complementary to the interleaving and rate matching performed in a transmit (TX) data processor 220, 282 and provide input LLRs. A turbo decoder 330 may decode each block of input LLRs from channel deinterleaver 320 using a code rate 316 and a code block size 318 and provide a decoded block. The turbo decoder 330 may be a parallel turbo decoder. A CRC checker 340 may check each decoded block and provide a decoding status for the block. An assembler 350 may assemble the decoded blocks using the code block size 318 and provide decoded data 322.

Figure 4:
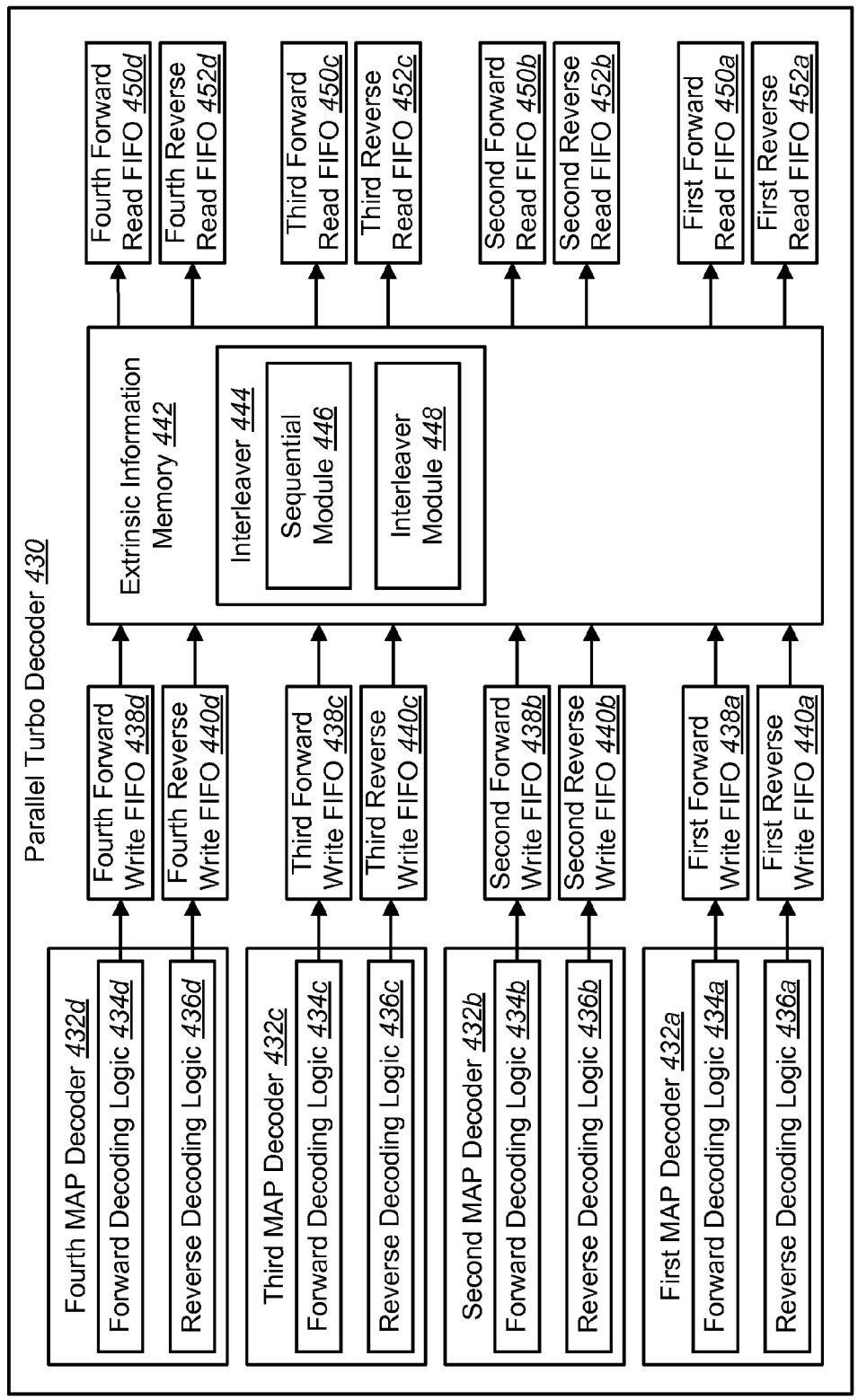
FIG. 4 is a block diagram illustrating a parallel turbo decoder.

FIG. 4 is a block diagram illustrating a parallel turbo decoder 430. One possible way to speed up turbo decoding is through parallel turbo decoding, i.e., multiple maximum a posteriori probability (MAP) decoders 432*a-d* working on different part of a code block concurrently. One possible way to perform turbo decoding is to use a sliding window turbo decoder structure. A sliding window approach may be suited for large packet sizes by saving state metrics in memory. However, a sliding window approach may also introduce decoding overhead. Furthermore, high coding rate applications, such as UMTS HSDPA, may use large sliding window sizes, which may use large amounts of memory for the state metrics. In contrast, the present systems and methods may use a non-sliding window approach that reduces the preloading latency of sliding windows.

In one configuration, there may be four MAP decoders 432a-d working in parallel, each with forward decoding logic 434a-d and reverse decoding logic 436a-d. The forward decoding logic 434a-d may determine one or more forward state metric (FSM) for a portion of a received code block. The reverse decoding logic 436a-d may determine one or more reverse state metrics (RSM) for a portion of the received code block. The forward decoding logic 434a-d may include a forward branch metric calculator, a forward state metric calculator (FSMC), a forward state metric buffer and a forward LLR calculator. The reverse decoding logic 436a-d may include a reverse branch metric calculator, a reverse state metric calculator (RSMC), a reverse state metric buffer and a reverse LLR calculator.

The forward decoding logic 434a-d may produce extrinsic information values, i.e., the forward state metric calculator (FSMC) may produce extrinsic information. Likewise, the reverse decoding logic 436a-d may produce extrinsic information values, i.e., the reverse state metric calculator (RSMC) may produce extrinsic information. These extrinsic information values may be used as a priori probability (APP) values by the MAP decoders 432a-d in the next half iteration. Though parallel turbo decoding may appear relatively straightforward, during implementation, it may be difficult to achieve a large bandwidth of extrinsic information for the four-MAP parallel turbo decoder 430. For a radix4 MAP decoder 432a-d, each FSMC or RSMC may read out two APP values from these memories per half iteration. Therefore, there may be 16 APP values read every half iteration, i.e., 4 (MAP decoders 432a-d)×2 (FSMC/RSMC per MAP decoder 432a-d)×2 (APP values per FSMC/RSMC). Once an LLR calculation is produced after a crossover point, 16 APP values may also be written to these memories per half iteration.

In one configuration, the extrinsic information memory 442 may be APP RAM with multiple banks. The APP RAM may be accessed according to two patterns or modes. During sequential mode, the MAP decoders 432a-d may be working on the sequential input code block, i.e., the even half iteration. During this pattern, the APP RAM may be read out and written into using sequential addresses. During interleaved mode, the MAP decoders 432a-d may be working on an interleaved code block, i.e., odd half iteration. During interleaved mode, the APP RAM may be read out and written into using interleaved addresses. The interleaver 444 may be defined differently for each communication standard and the scheme by which the extrinsic information memory 442 is accessed may have minimum bandwidth targets for reading and writing. The present systems and methods may enable 16 APP values to be read per clock during the full half iteration and 16 APP values to be written per clock during the second half of each half iteration (after RSMC and FSMC have crossed over). This may include using proper APP memory banking, MAP decoder 432a-d misalignment and introducing the read FIFOs 450a-d, 452a-d for the pre-fetched APP values. The extrinsic information memory (i.e., APP random access memory) may be shared among multiple standards (e.g., LTE, CDMA, WCDMA, WiMAX) and a minimal number of banks in the APP RAM may be used based on area and power considerations.

The APP values from the forward decoding logic 434a-d may be stored across four forward write first-in-first-out queues (FIFOs) 438a-d and the APP values from the reverse decoding logic 436a-d may be stored across four reverse write FIFOs 440a-d. This may include storing each row in the extrinsic information produced by the MAP decoders 432a-d in a different bank in the extrinsic information memory 442.

The forward write FIFOs 438a-d and reverse write FIFOs 440a-d may be stored in extrinsic information memory 442. An interleaver 444 may determine the address for storage within the extrinsic information memory 442, i.e., a sequential module 446 may determine sequential addresses during even half iterations and an interleaver module 448 may determine interleaved addresses during odd half iterations. The extrinsic information may be pre-fetched into a series of read FIFOs for the next half iteration. In other words, the MAP decoders 432a-d may read the extrinsic information that is pre-fetched into the read FIFOs. Specifically, the forward decoding logic 434a-d in the MAP decoders 432a-d may read the extrinsic information from the forward read FIFOs 450a-d and the reverse decoding logic 436a-d may read the extrinsic information from the reverse read FIFOs 452a-d.

In one configuration, the extrinsic information memory 442 accesses may be staggered according to the operation being performed. For example, during even half iterations, the forward write FIFOs 438a-d may be misaligned with the reverse write FIFOs 440a-d, i.e., creating two phases. Likewise, the forward read FIFOs 450a-d may be misaligned with the reverse read FIFOs 452a-d. During odd half iterations, however, each write FIFO 438a-d, 440a-d may be misaligned with each other, i.e., 8 phases. Likewise, each read FIFO 450a-d, 452a-d may be misaligned with each other. The misalignment of memory access will be discussed in further detail below.

Figure 5:
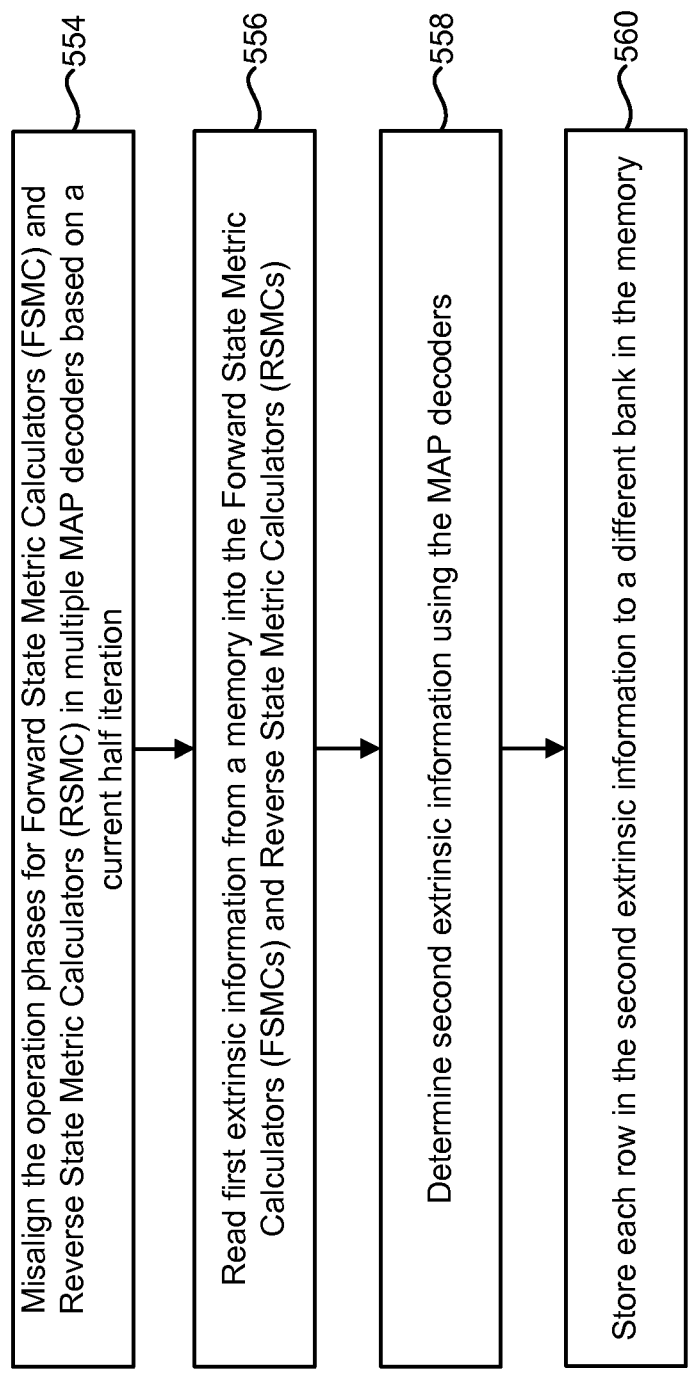
FIG. 5 is a flow diagram illustrating a method of accessing memory during turbo decoding.

FIG. 5 is a flow diagram illustrating a method 500 of accessing memory during turbo decoding. The method 500 may be performed by a parallel turbo decoder 430. The turbo decoder 430 may misalign 554 the operation phases for forward state metric calculators (FSMCs) and reverse state metric calculators (RSMCs) in multiple MAP decoders 432a-d based on a current half iteration. In other words, during even half iterations, the forward write FIFOs 438a-d may be misaligned 554 with the reverse write FIFOs 440a-d, i.e., creating two phases. Likewise, the forward read FIFOs 450a-d may be misaligned 554 with the reverse read FIFOs 452a-d. During odd half iterations, however, each write FIFO 438a-d, 440a-d may be misaligned 554 with each other, i.e., 8 phases. Likewise, each read FIFO 450a-d, 452a-d may be misaligned 554 with each other.

The parallel turbo decoder 430 may also read 556 first extrinsic information from a memory into the FSMCs and RSMCs. In other words, extrinsic information from a previous half iteration may be pre-fetched into forward read FIFOs 450a-d and reverse read FIFOs 452a-d. The parallel turbo decoder 430 may also determine 558 second extrinsic information using the MAP decoders 432a-d, i.e., using forward decoding logic 434a-d and reverse decoding logic 436a-d.

The parallel turbo decoder 430 may also store 560 each row in the second extrinsic information to a different bank in the memory. Storing each row to different bank in the memory may allow multiple values to be read out during odd half iterations without memory conflicts. As discussed above, the parallel turbo decoder 430 may read 16 APP values and write 16 APP values per cycle in both even and odd half iterations. This may be relatively straightforward during even half iteration by storing the APP values in the extrinsic information memory 442 in sequential way since each MAP decoder 432a-d may be working on one quarter of the sequential inputs of the code block.

However, a memory access scheme may encounter memory conflicts during odd half iterations when 16 APP value are read out and written in the extrinsic information memory 442 using interleaved address. For 3G standards, such as WCDMA and CDMA, the interleaver 444 may be a block interleaver. During sequential mode, a block interleaver may read data from the extrinsic information memory 442 horizontally, row by row, from left to right. During interleaver mode, a block interleaver may read data vertically, top down, column by column. Therefore, the interleaver 444 may store each row to different memory banks within the extrinsic information memory 442. This may allow multiple values to be read from the extrinsic information memory 442 during interleaver mode without memory conflicts.

In one configuration, WCDMA systems may use a 20 row block interleaver. By traversing the 20 rows using the interleaved address generated by sequential input, the interleaver 444 may have a maximum of 3 rows of dummy bits. In other words, the maximum number of dummy bit rows for any packet configuration in WCDMA is 20. Therefore, even in the worst case scenario, up to 17 APP values may be read from the extrinsic information memory 442 without any conflicts, thus meeting the 16 APP value bandwidth for a turbo decoder 430 with four MAP decoders 432a-d. Similarly, in a CDMA configuration, the interleaver 444 may use a 32 row block interleaver. By traversing the 32 rows using the interleaved address generated by sequential input, the interleaver 444 may enable at least 16 valid APP values to be read and written, thus meeting the 16 APP value bandwidth for a turbo decoder 430 with four MAP decoders 432a-d.

Figure 6:
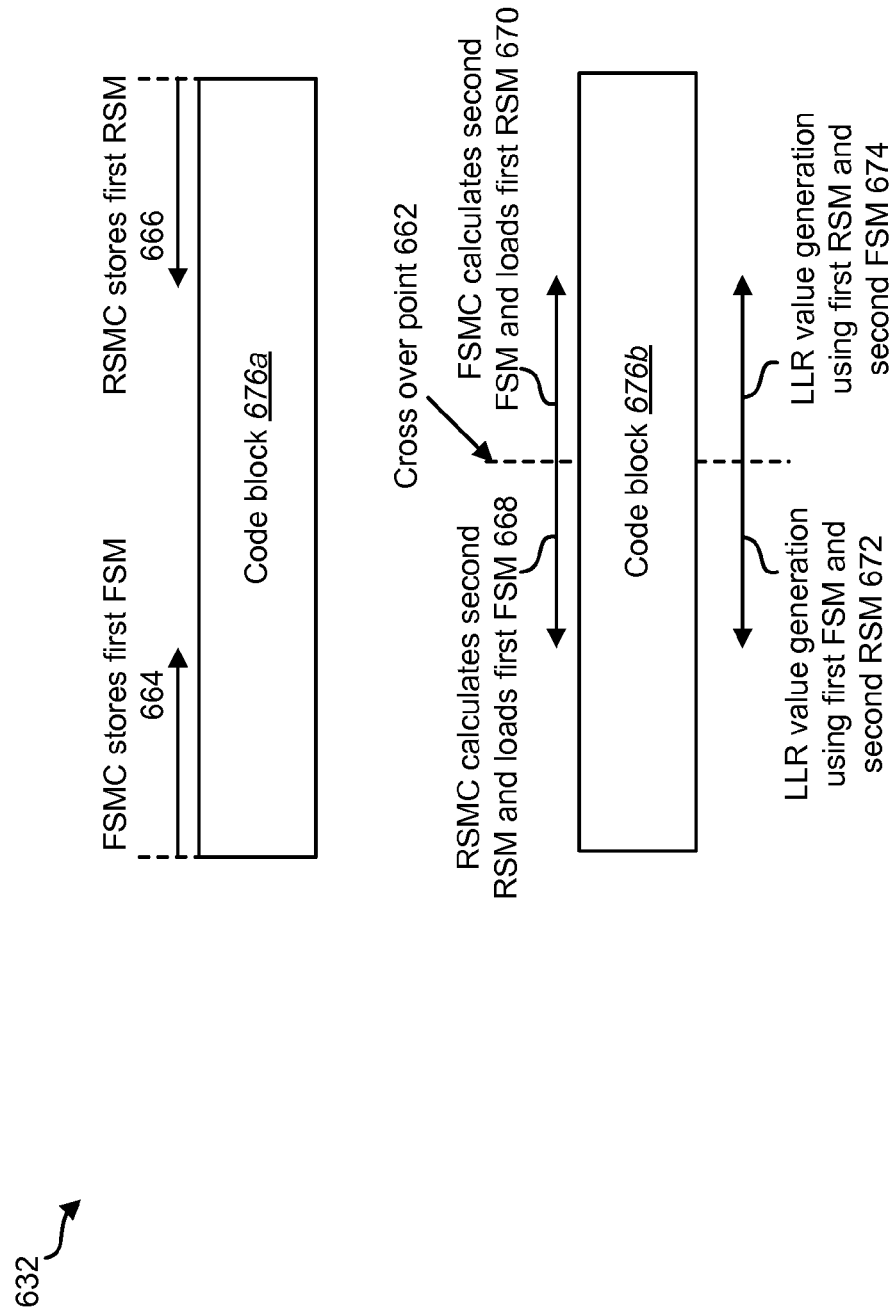
FIG. 6 is a block diagram illustrating the operation of a single MAP decoder.

FIG. 6 is a block diagram illustrating the operation of a single MAP decoder 632. Specifically, FIG. 6 illustrates the operation of the MAP decoder 632 during a half iteration of a turbo decoding cycle. A forward state metric (FSM) and a reverse state metric (RSM) may be used to determine an LLR value, i.e., to decode the data. In MAP decoding, two FSMs and two RSMs may be determined for a code block 676a-b, i.e., an FSM and RSM for each half of the code block 676a-b.

The MAP decoder 632 may use the non-sliding window approach, where a forward state metric calculator (FSMC) works concurrently with a reverse state metric calculator (RSMC) and saves a first forward state metric (FSM) 664 and a first reverse state metric (RSM) 666 during the first half of each half iteration. After a cross over point 662 (the point at which the FSMC and RSMC meet in the middle of the code block 676a-b), the FSMC may calculate a second FSM and load the stored first RSM 668. Similarly, the RSMC may calculate a second RSM and load the stored first FSM 670 after the cross over point 662. An LLR calculator may then decode the LLR (log-likelihood ratio) for each half of the code block 676a-b. In other words, the LLR for the first half of the code block 676a-b may use the first FSM and the second RSM 672 and the LLR for the second half of the code block 676a-b may use the first RSM and the second FSM 674. Thus, there may be little or no decoding overhead compared to a sliding window approach. For zero tail convolutional turbo code (CTC), the turbo encoder may start and end the trellis state at "0." Therefore, both the FSMC and RSMC in the MAP decoder 632 may be initialized as state "0" with the largest probability while other states have the least probability. Thus, no warming up of the state metric calculators may be needed.

Figure 7:
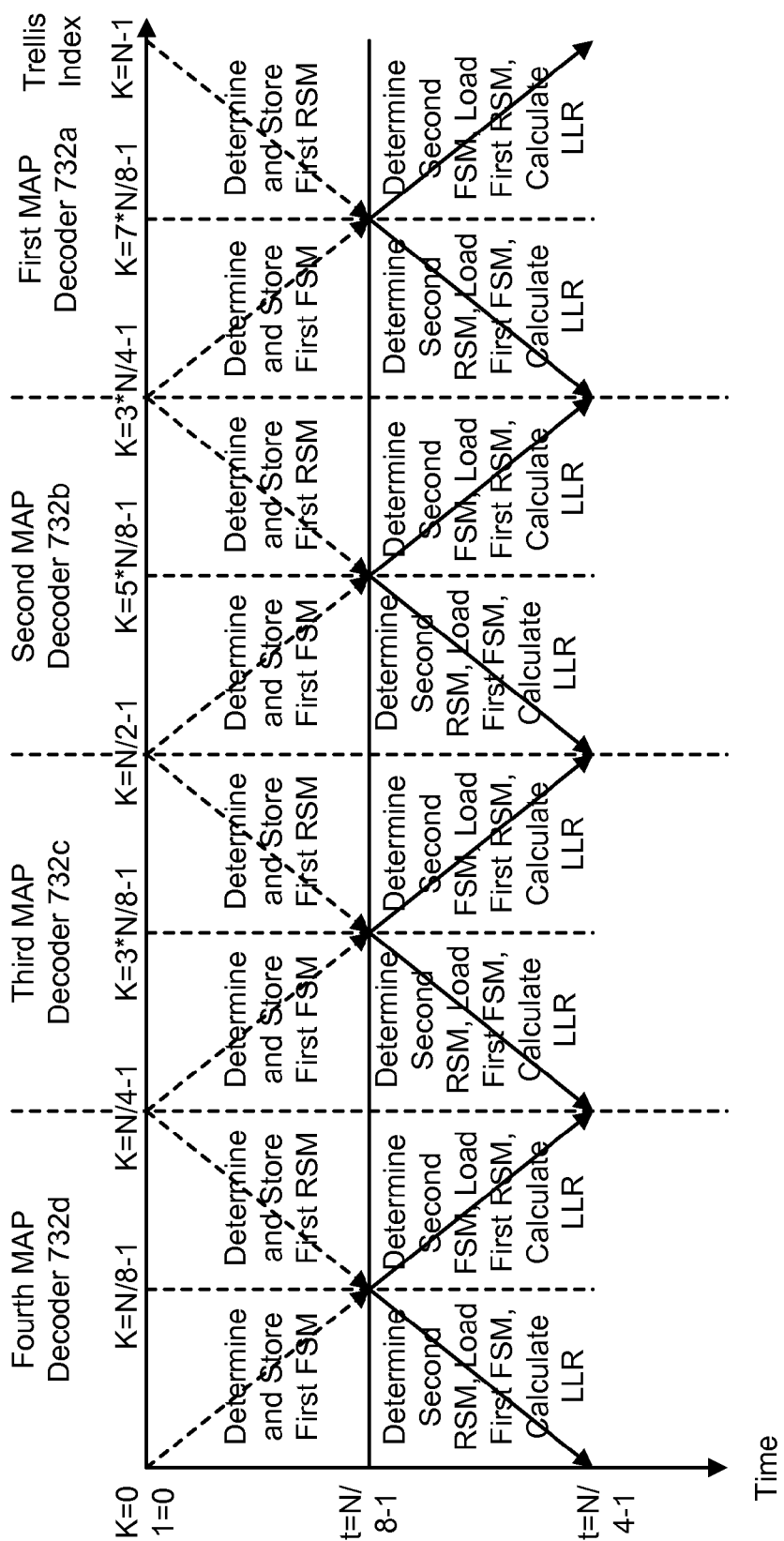
FIG. 7 is a flow diagram illustrating the operation of parallel turbo decoder.

FIG. 7 is a flow diagram illustrating the operation of a parallel turbo decoder. Specifically, FIG. 7 illustrates the operation of one configuration of a turbo decoder that uses four MAP decoders 732a-d as a function of trellis index and time, e.g., four instances of the MAP decoder 632 illustrated in FIG. 6 decoding a single code block. One possible way to speed up the turbo decoding process is through parallel decoding. In parallel decoding, multiple MAP decoders 732a-d may operate on different parts of a coding block concurrently, i.e., each MAP decoder 732a-d may decode one fourth of the code block. Specifically, for a code block of size N, the fourth MAP decoder 732d may decode from trellis index K=0 to K=N/4−1, the third MAP decoder 732c may decode from trellis index K=N/4−1 to K=N/2−1, the second MAP decoder 732b may decode from trellis index K=N/2−1 to K=3*N/4−1 and the first MAP decoder 732a may decode from trellis index K=3*N/4−1 to K=N−1.

As before, the MAP decoders 732a-d may use a non-sliding window approach. For example, from time t=0 to t=N/8−1, an FSMC may determine and store a first FSM and an RSMC may determine and store a first RSM for each MAP decoder 732a-d. During the second half of the half iteration (from time t=N/8−1 to t=N/4−1), the FSMC may determine a second FSM and load the stored first RSM for an LLR calculator. Similarly, the RSMC may determine a second RSM and load the stored first FSM for the LLR calculator.

Since some FSMCs and RSMCs may not start at the beginning or end of the code block (e.g., the second MAP decoder 732b and third MAP decoder 732c), a state propagating approach may be used to set their initial conditions. This may include using an adjacent MAP decoder's final state metric for a different MAP decoder's initial state metric in the following half iteration. This approach may reduce the training period of each MAP decoder 732a-d and make the parallel MAP decoders 732a-d converge faster.

In a zero tail convolutional turbo code configuration (i.e., LTE, WCDMA, CDMA), the first FSM of the fourth MAP decoder 732d and the first RSM of the first MAP decoder 732a may be initialized as the highest probability. The first FSM of the first MAP decoder 732a, second MAP decoder 732b and third MAP decoder 732c may be initialized with the second FSM of the second MAP decoder 732b, third MAP decoder 732c and fourth MAP decoder 732d, respectively, in the previous half iteration. The first RSM of the second MAP decoder 732b, third MAP decoder 732c and fourth MAP decoder 732d may be initialized with the second RSM of the first MAP decoder 732a, second MAP decoder 732b and third MAP decoder 732c, respectively, in the previous half iteration.

In a tail biting convolutional turbo code configuration (i.e., WiMAX), the first FSM of the fourth MAP decoder 732d may be initialized with the second FSM of first MAP decoder 732a in the previous half iteration. The first RSM of the first MAP decoder 732a may be initialized with the second FSM of the fourth MAP decoder 732d in the previous half iteration. The first FSM of the first MAP decoder 732a, second MAP decoder 732b and third MAP decoder 732c may be initialized with the second FSM of the second MAP decoder 732b, third MAP decoder 732c and fourth MAP decoder 732d, respectively, in the previous half iteration. The first RSM of the second MAP decoder 732b, third MAP decoder 732c and fourth MAP decoder 732d may be initialized with the second RSM of the first MAP decoder 732a, second MAP decoder 732b and third MAP decoder 732c, respectively, in the previous half iteration.

Figure 8:
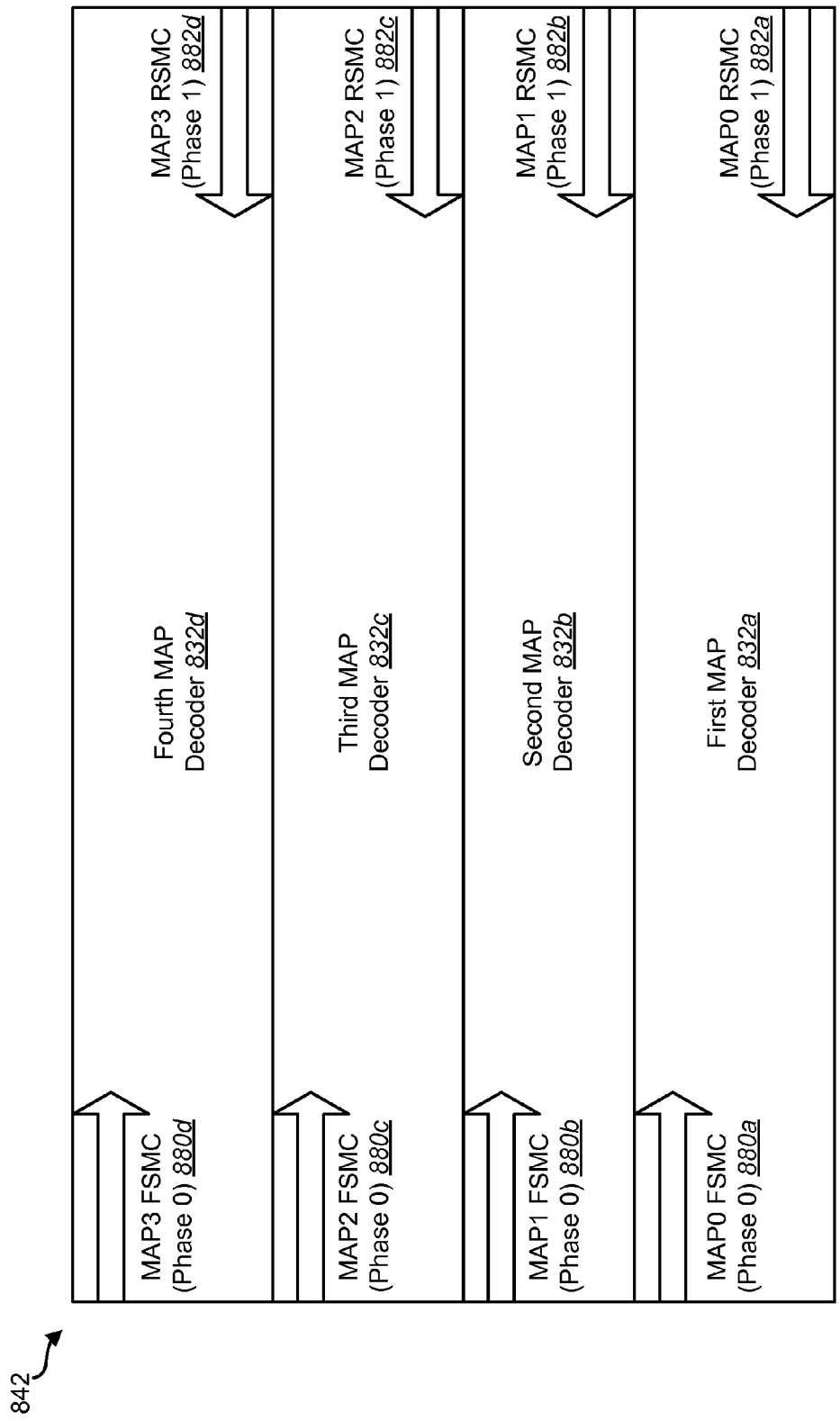
FIG. 8 is a block diagram illustrating the misalignment of decoding streams.

FIG. 8 is a block diagram illustrating the misalignment of decoding streams. Specifically, FIG. 8 illustrates misaligned operation phases for FSMCs 880a-d and RSMCs 882a-d in four MAP decoders 832a-d during sequential half iterations. FIG. 8 illustrates the extrinsic information memory 842 as a big single memory to hold the whole code block's APP values. The memory 842 may also be treated as the storage for the block interleaver 444. Memory accesses within the MAP decoders 832a-d may be misaligned to two phases, phase 0 and phase 1 for an even (sequential) half iteration. At phase 0, the forward access for all the MAP decoders 832a-d may occur, i.e., the FSMCs 880a-d. Then, while at phase 1, the backward access for the MAP decoders 832a-d may occur, i.e., the RSMCs 882a-d.

In other words, the forward read and write operations performed by the FSMCs 880a-d may be staggered in a different phase than the reverse read and write operations performed by the RSMCs 882a-d. This staggering of forward access phase and reverse access phase, also known as decoder stream misalignment, may occur in each MAP decoder 832a-d, i.e., the forward access operations in all the MAP decoders 880a-d may be in sync. In this way, different MAP decoders 832a-d may access different rows at the same time while still avoiding memory conflicts. This stream misalignment may be used for both read and write operations.

Figure 9:
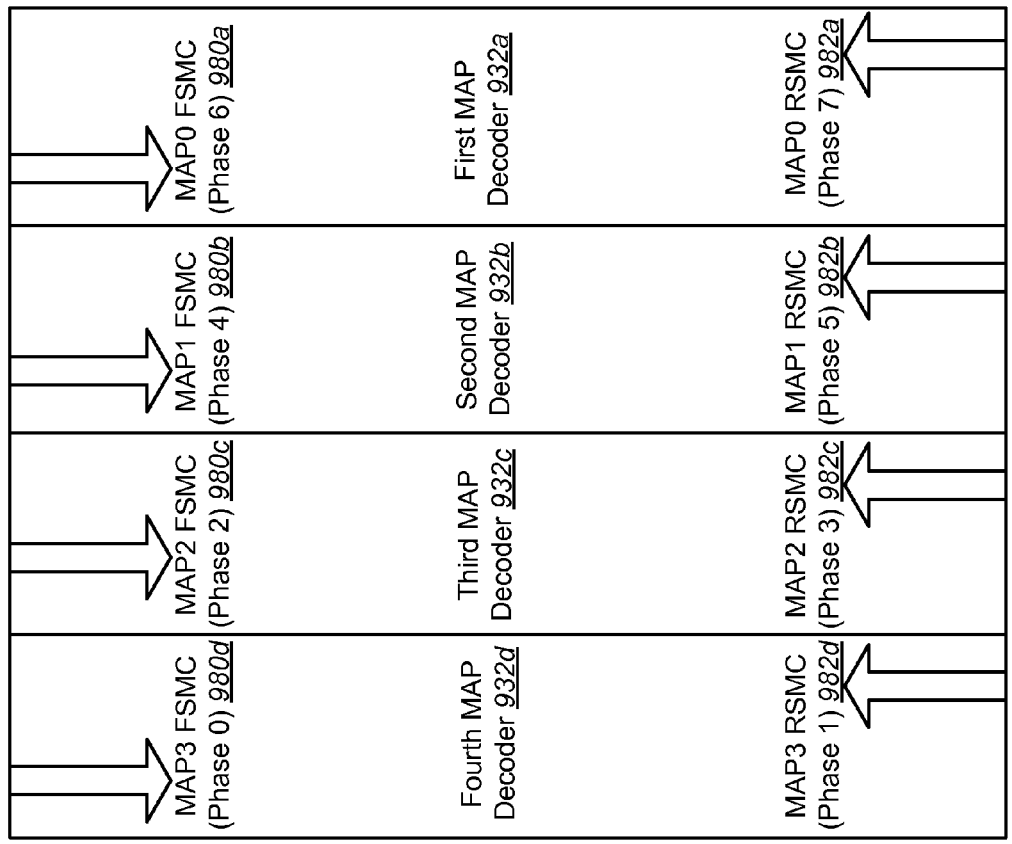
FIG. 9 is another block diagram illustrating the misalignment of decoding streams.

FIG. 9 is another block diagram illustrating the misalignment of decoding streams. Specifically, FIG. 9 illustrates misaligned operation phases for FSMCs 980a-d and RSMCs 982a-d in four MAP decoders 932a-d during interleaved half iterations. FIG. 9 also illustrates the extrinsic information memory 942 as a single memory to hold the whole code block's APP values. As before, the different MAP decoder 932a-d read and write accesses may be divided into different phases. Here, however, only one MAP decoder 832a-d may be allowed to write or read for one direction at the same time because data is read out column by column, instead of row by row, during interleaved odd half iterations. Therefore, the MAP decoders 932a-d may be misaligned to eight phases, phase 0 to phase 7 during odd iterations.

At phase 0, the fourth MAP decoder's forward decoding logic may access the extrinsic memory, i.e., the fourth MAP decoder FSMC 980d may be assigned phase 0. Furthermore, the third MAP decoder FSMC 980c may be assigned phase 2, the second MAP decoder FSMC 980b may be assigned phase 4 and the first MAP decoder FSMC 980a may be assigned phase 6. Similarly, the fourth MAP decoder RSMC 982d may be assigned phase 1, the third MAP decoder RSMC 982c may be assigned phase 3, the second MAP decoder RSMC 982b may be assigned phase 5 and the first MAP decoder RSMC 982a may be assigned phase 7.

Fourth generation (4G) standards such as LTE and WiMAX may use a modular function-based interleaver, not a block interleaver that saves horizontally and reads out vertically. If all the MAP decoders 932a-d run at the same time and store APP values using a modular function, there may not be any address conflicts. For example, in LTE mode, only 16 of 96×32 memory banks may be used to support packet sizes of up to 6144 and at the same time provide 16 APP values/cycle read and write bandwidth. The memory bank in which each APP value is stored may be determined by using the address divided by ¼ of the packet size and then modular by 4. This may reutilize the memory banks designed for WCDMA and CDMA, making the whole APP RAM structure (i.e., the extrinsic information memory) compatible for all standards. The banking structure may be similar for WiMAX.

Figure 10:
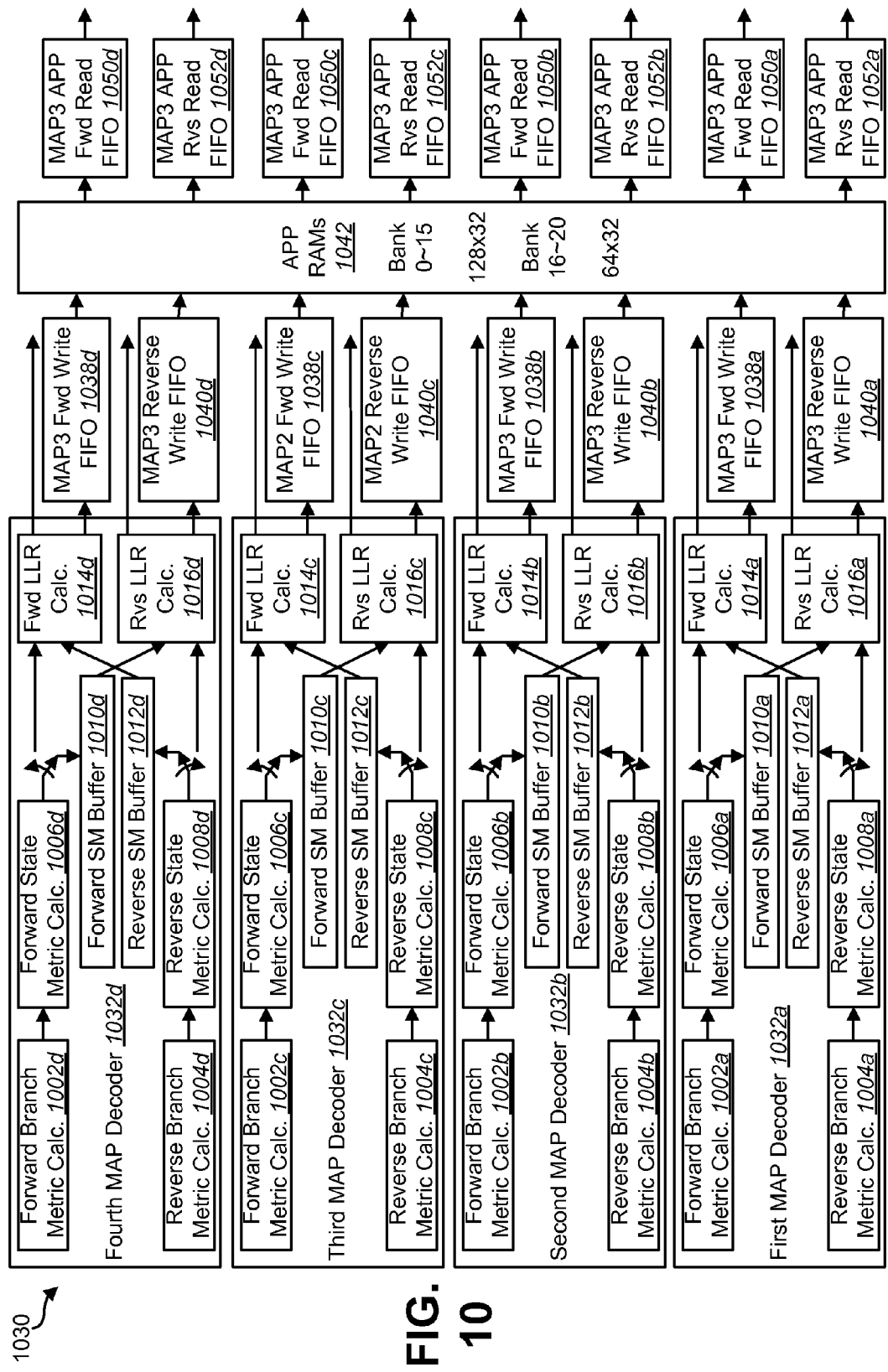
FIG. 10 is a block diagram of a parallel turbo decoder with four MAP decoders.

FIG. 10 is a block diagram of a parallel turbo decoder 1030 with four MAP decoders 1032a-d. Each MAP decoder 1032a-d may include a forward branch metric calculator 1002a-d and a reverse branch metric calculator 1004a-d that feed into a forward state metric calculator (FSMC) 1006a-d and a reverse state metric calculator (RSMC) 1008a-d. As illustrated in FIG. 6, the FSMC 1006a-d may traverse a code block in the forward direction while the RSMC 1008a-d traverses the code block in the reverse direction. During the first half of a half iteration, the FSMC 1006a-d may determine and store a first forward state metric (FSM) in a forward state metric buffer 1010a-d. Likewise, the RSMC 1008a-d may determine and store a first reverse state metric (RSM) in a reverse state metric buffer 1012a-d. During the second half of the half iteration, a forward LLR calculator 1014a-d may receive a second FSM and the stored first RSM (from the reverse state metric buffer 1012a-d) and determine a forward LLR as well as two forward APP values. The forward APP values may be stored in a forward write FIFO 1038a-d before being stored in APP RAMs 1042, i.e., extrinsic information memory. Similarly, a reverse LLR calculator 1016a-d may receive the stored first FSM (from the forward state metric buffer 1010a-d) and a second RSM and determine a reverse LLR as well as two reverse APP values. The reverse APP values may be stored in a reverse write FIFO 1040a-d before being stored in the APP RAMs 1042.

The parallel turbo decoder 1030 may include 20 banks of APP RAM 1042. CDMA turbo decoding may use 32 banks of APP RAM 1042 to support four MAP decoders 1032a-d. However, CDMA multiple carrier data only (MCDO) may only use 2 MAP decoders 1032a-d. Therefore, the parallel turbo decoder 1030 may only include 20 banks of APP RAMs 1042 (instead of 32 banks) in order to meet the worst requirement of WCDMA. Then, during CDMA, each bank of APP RAM 1042 may save two rows for (to meet the 8 APP value per cycle bandwidth of 2 MAP decoders 1032). Therefore, 16 of the 20 APP banks 1042 may serve the purpose of both CDMA and LTE application.

In one configuration, the APP RAM banks 1042 may be dual port memories (16 128×32 memories and 4 64×32 memories), which may support multiple standards, including WiMAX, which uses a relatively small code block. If 45 nm dual port rams are not fast enough, two copies of single port rams may be used as ping pong buffers where read and write operations are switched on each copy during different half iterations.

In addition to forward write FIFOs 1038a-d and forward read FIFOs 1040a-d, the parallel turbo decoder 1030 may include forward read FIFOs 1050a-d and reverse read FIFOs 1052a-d. In one configuration, the forward read FIFOs 1050a-d and reverse read FIFOs 1052a-d may be used during 3G to pre-fetch the APP values out of the APP RAMS 1042 for the next half iteration. However, the read FIFOs 1050a-d, 1052a-d may not be used during 4G since there are no phases for APP RAM access, i.e., all the MAP decoders 1032a-d may perform forward and backward decoding at the same time.

In one configuration, the parallel turbo decoder 1030 may be clocked at 288 MHz. In this configuration, the turbo decoding throughput may be estimated as: 16 (4 MAP decoders emit 16 bits per clk)×0.5 (LLR only gets generated half of the time)×288 (system clk)/15 (assuming 15 half iterations to be run)=about 150 MBits/sec.

The real throughput may be slightly less than 150 MBits/sec when the pipeline latency and decoder input buffer loading time for the first code block are included. The area on an integrated circuit of the parallel turbo decoder 1030 may be about 2 mm^2 if it includes a ping pong decoder input buffer and supporting logic to interface with channel de-interleavers of all standards. The average power of the parallel turbo decoder 1030 may be about 130 mW if running at 288 MHz with all four MAP decoders 1032a-d are activated.

Figure 11:
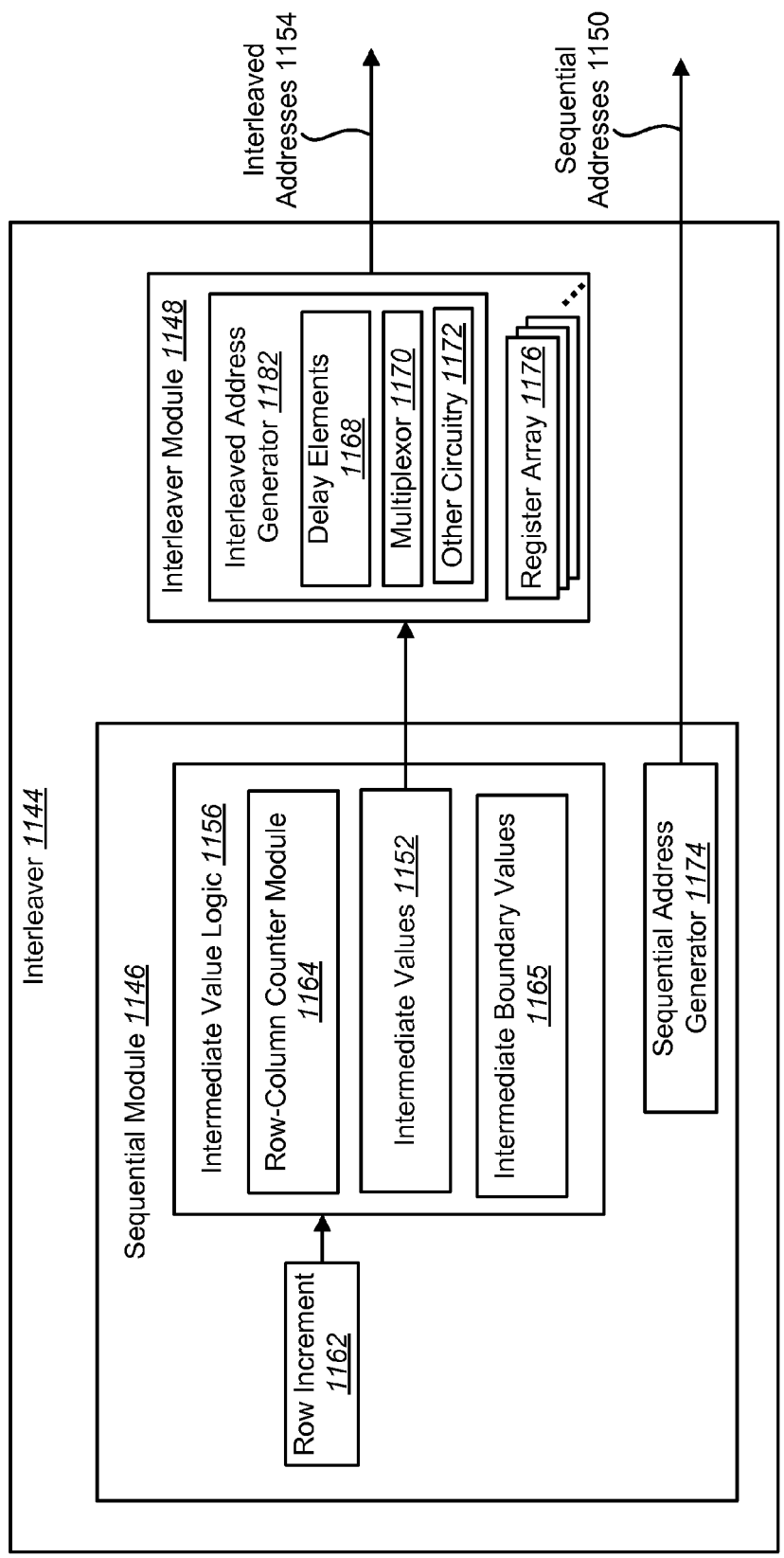
FIG. 11 is a block diagram of an interleaver that may be used with a parallel turbo decoder.

FIG. 11 is a block diagram of an interleaver 1144 that may be used with a parallel turbo decoder. In one configuration, the interleaver 1144 may enable parallel interleaving address generation for a high-speed, single-core WCDMA turbo decoder. This may include simultaneously generating multiple interleaving addresses using a high-speed recursion architecture to optimize the timing of the WCDMA turbo interleaver 1144. In addition, the interleaver 1144 may use fast row-column and column-row modulo adders for matrix permutation. In other words, the interleaver 1144 may generate the addresses (interleaved addresses 1154 in odd half iterations and sequential addresses 1150 in even half iterations) used for both APP RAM read and write access. These addresses may be used for a read operation first and then buffered for a write operation in the same half iteration.

WCDMA turbo code may use a relatively complex interleaving pattern. The interleaver 1144 may simultaneously generate multiple interleaved addresses 1154 during parallel decoding of a WCDMA turbo code. This may include using a fast recursion architecture for the generation of WCDMA turbo interleaving address. This may also include using fast row-column and column-row modulo adders for the matrix permutation-based turbo interleaver 1144.

The interleaver 1144 may be a block interleaver and may include a sequential module 1146 and an interleaver module 1148. A sequential address generator 1174 may determine sequential addresses 1150 during sequential half iterations. The sequential module 1146 may generate intermediate values 1152 during interleaving half iterations for interleaved address 1154 generation. The intermediate values 1152 may be computed using $(j*r_i)$ mod $(p-1)$, where j is a column number in a rectangular matrix, $r_i$ is the ith permuted prime integer and p is a prime number, as defined in 3GPP TS 25.212, Section 4.2.3.2.3.

In addition, the sequential module 1146 may determine the intermediate boundary values 1165 during the first sequential half iterations. The intermediate boundary values 1165 may be used in every interleaving half iteration to enable the derivation of the intermediate values 1152 for interleaved address 1154 generation. In other words, the intermediate boundary values 1165 from the first sequential half iteration may be used to compute the interleaved address 1154 at the boundaries during interleaved half iterations. The intermediate values 1152 generated in the previous clock cycle may be used to compute other values in the interleaved addresses 1154 not at the boundaries.

Figure 13:
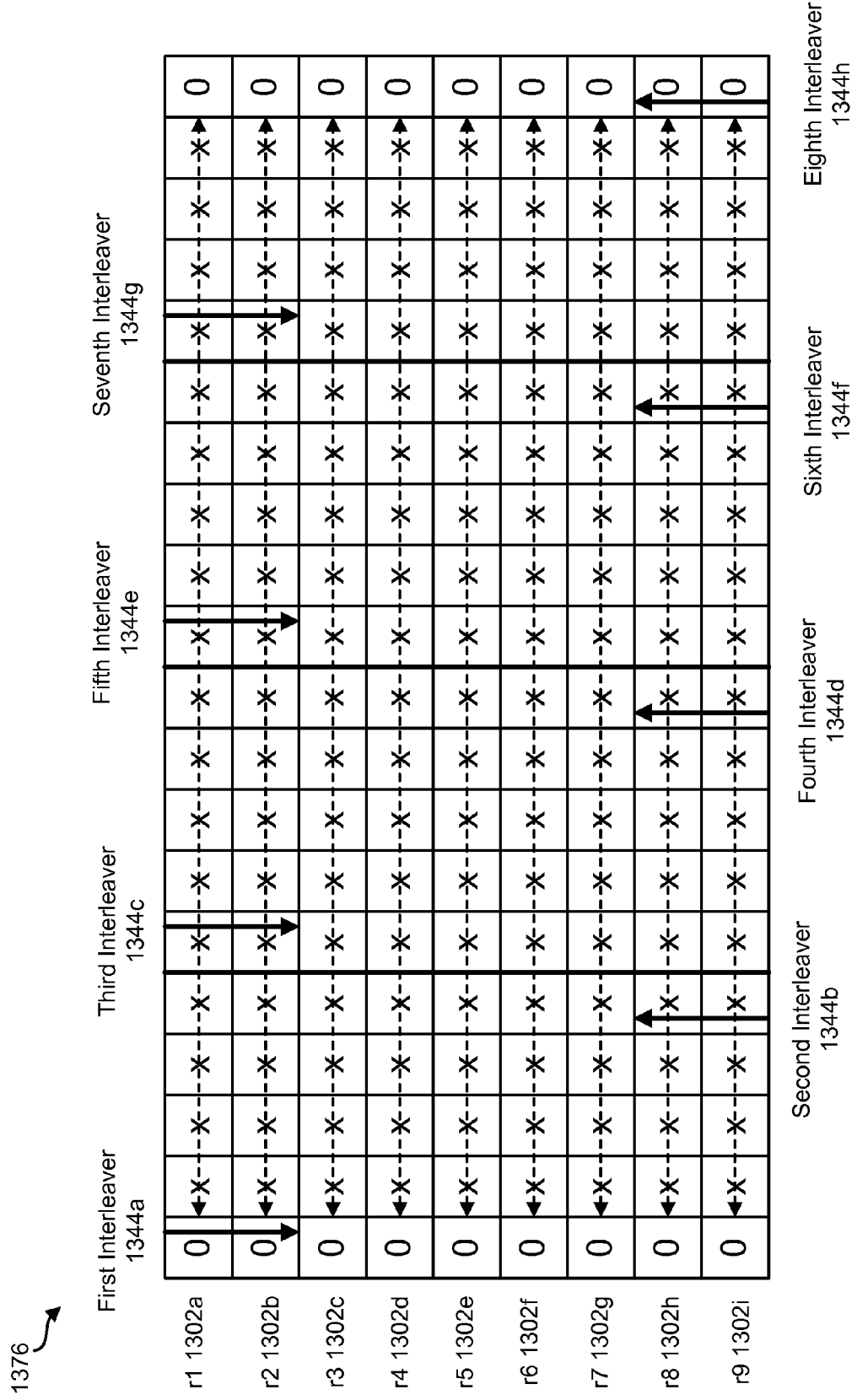
FIG. 13 is a block diagram illustrating parallel interleaved address generation during parallel turbo decoding.

In other words, intermediate boundary values 1165 may be the intermediate values 1152 at the matrix boundary positions. The intermediate boundary values 1165 may be computed and stored during the first half iteration. In every interleaving half iteration, the row-column counter module 1164 may generate column-wise sequential counter values. If the sequential counter values are located at the matrix segment boundary, as shown in FIG. 9 or FIG. 13, the intermediate boundary values 1165 corresponding to the sequential counter values may be directly used as intermediate values 1152 to further generate interleaved addresses 1154 with interleaver module 1148. Otherwise, intermediate values 1152 may be recursively derived from the previous intermediate value 1152 in the same row. Then the interleaved addresses 1154 may be generated by the interleaver module 1148.

In one configuration, intermediate value logic 1156 may receive a row increment 1162 as input. The intermediate value logic 1156 may use a row-column counter module 1164 and additional logic to produce intermediate values 1152 for every interleaving half iteration. Other configurations of the intermediate value logic 1156 may use other inputs or different circuitry to determine the intermediate boundary values 1165 during the first sequential half iterations. An interleaved address generator 1182 may use the intermediate values 1152 to produce the interleaved addresses 1154, i.e., using delay elements 1168, a multiplexor 1170 and other circuitry 1172. Other configurations of the interleaved address generator 1182 may use other inputs or different circuitry to determine the interleaved addresses 1154.

In the computation of WCDMA turbo interleaved addresses 1154, a base sequence with maximum length of 256 may be used for intra-row permutation. The base sequence may change with the code block length. At a time instance, the need base sequence values for all parallel interleavers 1144 may be different. However, they may belong to the same base sequence. Therefore, the base sequence may be stored to an array of 256×8 registers 1176. This may allow all turbo interleavers to share the same hardware resource for a base sequence while still supporting the minimum access bandwidth for multiple turbo interleavers.

Figure 12:
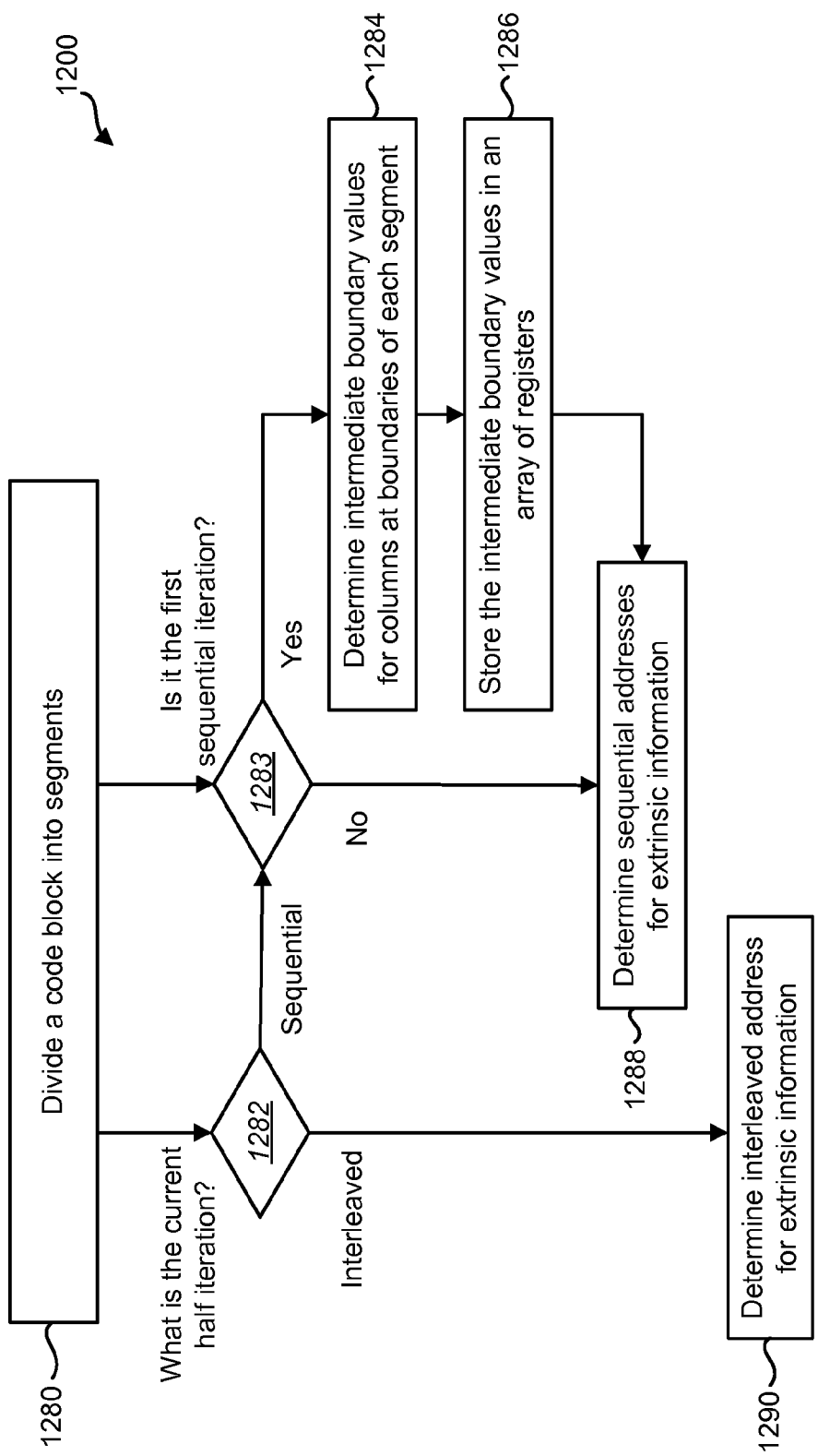
FIG. 12 is a flow diagram illustrating a method for determining memory addresses during parallel turbo decoding.

FIG. 12 is a flow diagram illustrating a method 1200 for determining memory addresses during parallel turbo decoding. The method 1200 may be performed by an interleaver 1144. The interleaver 1144 may divide 1280 a code block into segments. In one configuration, the interleaver 1144 may divide 1280 the code block into four segments. The interleaver may determine 1282 whether the current iteration is a sequential half iteration or an interleaved half iteration. If the current iteration is a sequential half iteration, the interleaver 1144 may determine 1288 sequential addresses for the extrinsic information, i.e., APP values produced by parallel MAP decoders. Concurrently, the interleaver 1144 may determine 1283 whether it is the first sequential half iteration. If the current iteration is the first sequential half iteration, the interleaver may also determine 1284 intermediate boundary values for columns at the boundaries of each segment. The interleaver 1144 may also store 1286 the intermediate boundary values in an array of registers. If the current iteration is an interleaved half iteration, the interleaver 1144 may determine 1290 interleaved addresses based on the intermediate boundary values. In other words, the method 1200 enables the interleaver 1144 to simultaneously determine multiple interleaved addresses during parallel turbo decoding.

FIG. 13 is a block diagram illustrating parallel interleaved address generation during parallel turbo decoding. In one configuration, the interleaver 1144 may operate in a WCDMA system. A WCDMA turbo code interleaver 1144 may use matrix-based intra-row and inter-row permutations. In the interleaving half iteration, the output of the turbo code interleaver 1144 may be the address sequence column by column of the intra-row and inter-row permuted R×C matrix, where R is the number of rows and C is the number of columns. Compared to other matrix based interleaving, such CDMA turbo interleaving, WCDMA turbo interleaving may include relatively complex intra-row permutation.

In the illustrated configuration, the code block 1376 may be divided into 4 segments. Four interleavers 1344 may provide interleaving addresses in the forward direction, i.e., a first interleaver 1344a, a third interleaver 1344c, a fifth interleaver 1344e and a seventh interleaver 1344g. Additionally, four interleavers 1344 may provide interleaving addresses in the backward direction, i.e., a second interleaver 1344b, a fourth interleaver 1344d, a sixth interleaver 1344f and an eighth interleaver 1344h. The output of each interleaver 1344 may be an interleaved address sequence column by column in the vertical direction. For every interleaving address, an address generation algorithm may use an intermediate value that is derived from a prime integer $r_i$ 1302a-i in the horizontal direction as indicated by the dashed arrows. The starting intermediate values for the first interleaver 1344a and the eighth interleaver 1344h may be 0. However, the starting intermediate values of every row for the other interleavers 1344b-g may be pre-computed. Therefore, a total of 60 pre-computed values in the column boundaries may be used if the permutation matrix includes 20 rows. Deriving 60 intermediate values, however, may include deriving up to about 5000 values for the longest code block 1376 size. On the other hand, it may be costly to store these intermediate boundary values using read-only memory (ROM) because the length of a code block 1376 may be any number in between 40 and 5114.

Therefore, intermediate value logic 1156 may compute these boundary values. This computation may be performed during the first sequential half iteration and the results may be latched in registers 1176. This may ensure that all required values are available for all interleaving half iterations. In one configuration, an efficient hardware processing unit (PU) may derive these intermediate boundary values. Each PU may use two adders and extra combinational logic. In order to ensure all computations are completed during the first sequential half iteration for all code block lengths, ten copies of the same processing units (PUs) may be used in a parallel turbo decoder with four MAP decoders. Using ten PUs may efficiently enable multiple interleavers in WCDMA mode for single-core parallel turbo decoding.

In one configuration, the code block may be a rectangular permutation matrix with R rows according to Equation (1):

$$R = \begin{cases} 5, & \text{if } (40 \leq K \leq 159) \\ 10, & \text{if } ((160 \leq K \leq 200) \text{ or } (481 \leq K \leq 530)) \\ 10, & \text{if } (K = \text{any other value}) \end{cases} \quad (1)$$

where K is the code block length. So, for a code block with a length between 160 and 200, or between 481 and 530, the code block may include ten rows as illustrated in FIG. 13.

Figure 14:
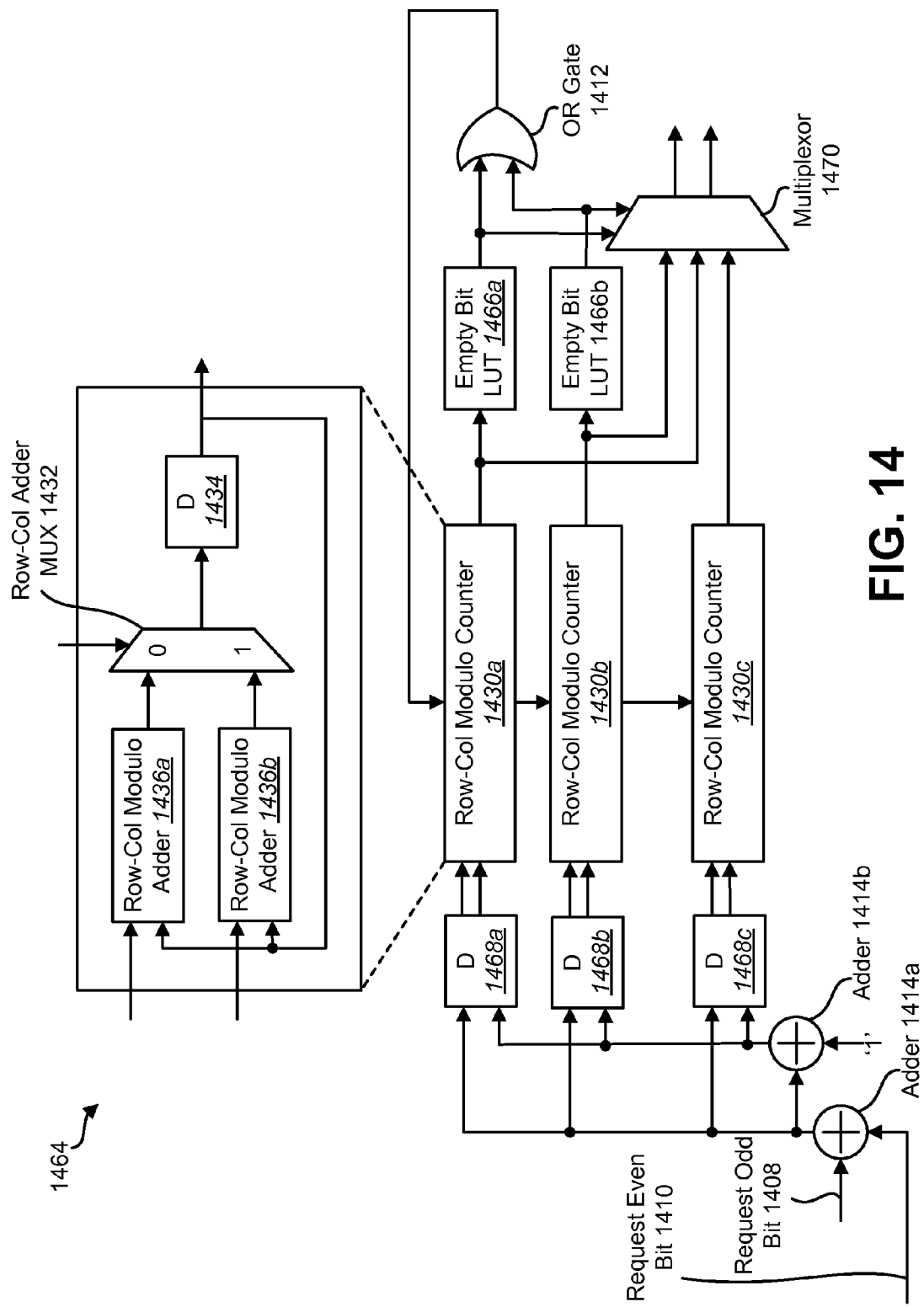
FIG. 14 illustrates one possible configuration of a row-column counter module for a radix-4 parallel turbo decoder.

FIG. 14 illustrates one possible configuration of a row-column counter module 1464 for a radix-4 parallel turbo decoder. The row-column counter module 1464 may be similar to the row-column counter module 1164 illustrated in FIG. 11 that determines intermediate values 1152 for every interleaving half iteration. The row-column counter module 1464 may include row-column modulo counters 1430*a-c*, empty bit look up tables (LUTs) 1466*a-b* and computation logic for the increase of row-column counters 1430*a-c*, i.e., delay registers 1468*a-c*, an adder 1414*a-b* that receives feedback and an indication of an address request for odd bit 1408 and even bit 1410 and an OR gate 1412 to provide the feedback. For a radix-4 decoder, two trellis stages are performed in each step of trellis trace. One stage associated with an even message bit 1410 and another stage associated to an odd message bit 1408. If the length of a segment is an odd number in the first (or last) trellis trace only one stage is performed. The row-column counter module 1464 may also include a multiplexor 1470 and some additional combinational logic. The empty bit LUTs 1466*a-b* may include the information of the matrix indices for dummy bits. The output of the LUTs 1466*a-b* may indicate if the interleaved address (corresponding to the input of the LUT) is a dummy bit or not. It may control the multiplexor 1470 to select two of three candidates.

Furthermore, the row-column modulo counters 1430*a-c* may each include two row-column adders 1436*a-b* and a row-column adder MUX 1432. In other words, a counter 1430*a-c* may be one or more adder 1436*a-b* with a delay element 1434. The delay element 1434 may include the previous counter 1430*a-c* value. The increase of the counter 1430*a-c* is input. The adder(s) 1436*a-b* may compute the summation of previous counter 1430*a-c* value and the increment. The increase value of the second row-column adder 1436*b* is larger (one) than that of the first row-column adder 1436*a*. The feedback value from the OR gate 1412 may be used to determine the adder output that is latched in the delay element 1434. This configuration may minimize the delay of the row-column counter module 1464 and allow the interleaver to achieve a required clock speed for the parallel turbo decoder.

Figure 15:
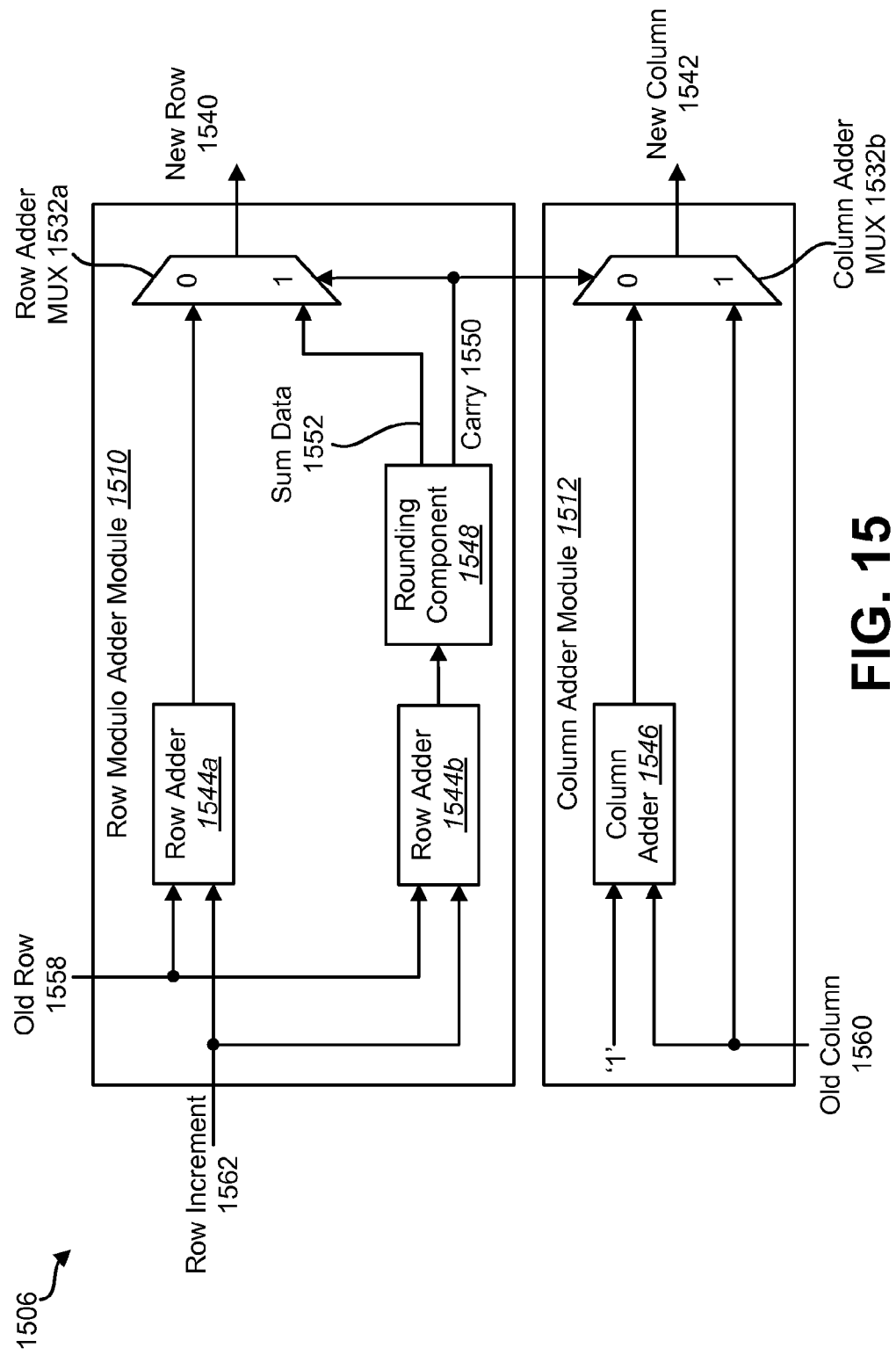
FIG. 15 is a block diagram illustrating a possible configuration of a row-column modulo adder.

FIG. 15 is a block diagram illustrating a possible configuration of a row-column modulo adder 1536. The row-column modulo adder 1536 may correspond to the row-column modulo adder 1436 illustrated in FIG. 14. In this configuration, the row modulo adder and the column adder may not be serially concatenated. Instead, the computation of the row modulo adder module 1510 and the computation of the column adder module 1512 may be concurrently performed. The row modulo adder module 1510 may include a first row adder 1544*a*, a second row adder 1544*b*, a rounding component 1548 and a row adder MUX 1532*a* that selects between a non-rounded summation and a rounded summation as the new row value 1540 of the row modulo adder module 1510. The row modulo adder module 1510 may receive a row increment 1562 and an old row value 1558 for the increase of new row value 1540.

The column adder component 1512 may determine a new column value 1542. This may include using an add-one column adder 1546 and a column adder MUX 1532*b*. Specifically, the column adder MUX 1532*b* may receive a sum from the column adder 1546 and the old column value 1560. Then, one of the two values may be selected as the new column value 1542. The select condition may be the carry bit 1550 from the row adder module 1510. This configuration may be faster than the serial concatenation of row modulo adder 1510 and column adder 1512.

Figure 16:
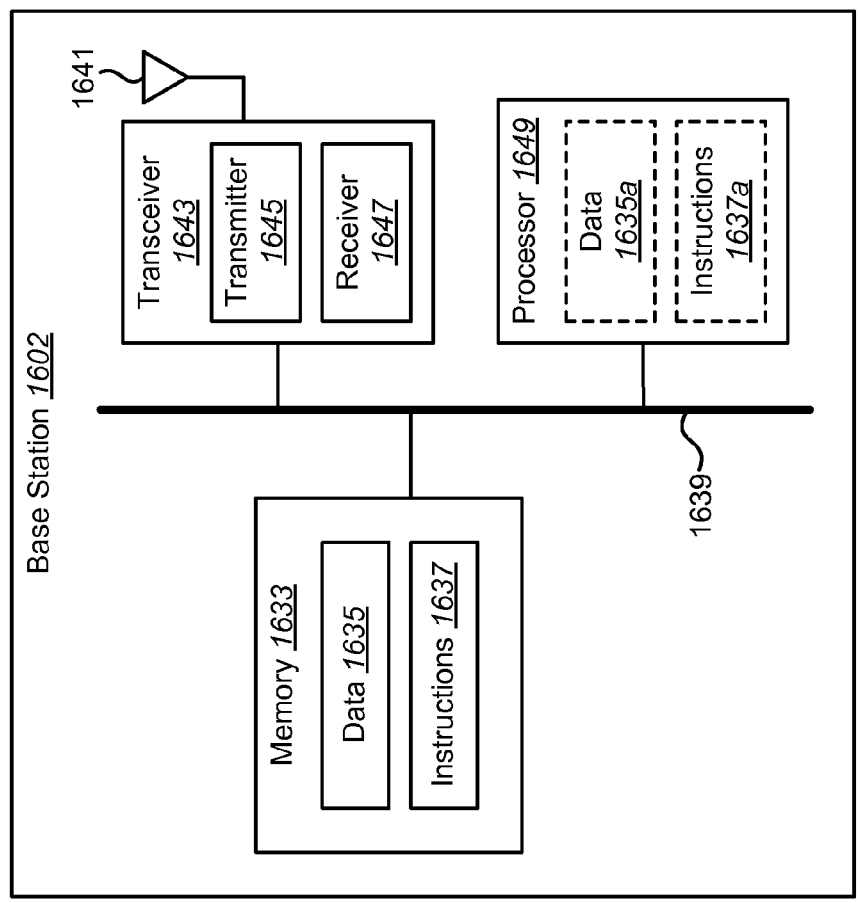
FIG. 16 illustrates certain components that may be included within a base station.

FIG. 16 illustrates certain components that may be included within a base station 1602. The base station 104 or communication devices discussed previously (e.g., in FIG. 1) may be configured similarly to the base station 1602 shown in FIG. 16. It should also be noted that a base station 1602 may be a communication device as termed herein.

The base station 1602 includes a processor 1649. The processor 1649 may be a general purpose single- or multi-chip microprocessor (e.g., an ARM), a special purpose microprocessor (e.g., a digital signal processor (DSP)), a microcontroller, a programmable gate array, etc. The processor 1649 may be referred to as a central processing unit (CPU). Although just a single processor 1649 is shown in the base station 1602 of FIG. 16, in an alternative configuration, a combination of processors (e.g., an ARM and DSP) could be used.

The base station 1602 also includes memory 1633 in electronic communication with the processor 1649 (i.e., the processor 1649 can read information from and/or write information to the memory 1633). The memory 1633 may be any electronic component capable of storing electronic information. The memory 1633 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers and so forth, including combinations thereof.

Data 1635 and instructions 1637 may be stored in the memory 1633. The instructions 1637 may include one or more programs, routines, sub-routines, functions, procedures, etc. The instructions 1637 may include a single computer-readable statement or many computer-readable statements. The instructions 1637 may be executable by the processor 1649 to implement the methods disclosed in connection with the access point, base station or communication device. Executing the instructions 1637 may involve the use of the data 1635 that is stored in the memory 1633. FIG. 16 shows some instructions 1637*a* and data 1635*a* being loaded into the processor 1649.

The base station 1602 may also include a transmitter 1645 and a receiver 1647 to allow transmission and reception of signals between the base station 1602 and a remote location. The transmitter 1645 and receiver 1647 may be collectively referred to as a transceiver 1643. An antenna 1641 may be electrically coupled to the transceiver 1643. The base station 1602 may also include (not shown) multiple transmitters, multiple receivers, multiple transceivers and/or multiple antenna.

The various components of the base station 1602 may be coupled together by one or more buses, which may include a power bus, a control signal bus, a status signal bus, a data bus, etc. For simplicity, the various buses are illustrated in FIG. 16 as a bus system 1639.

Figure 17:
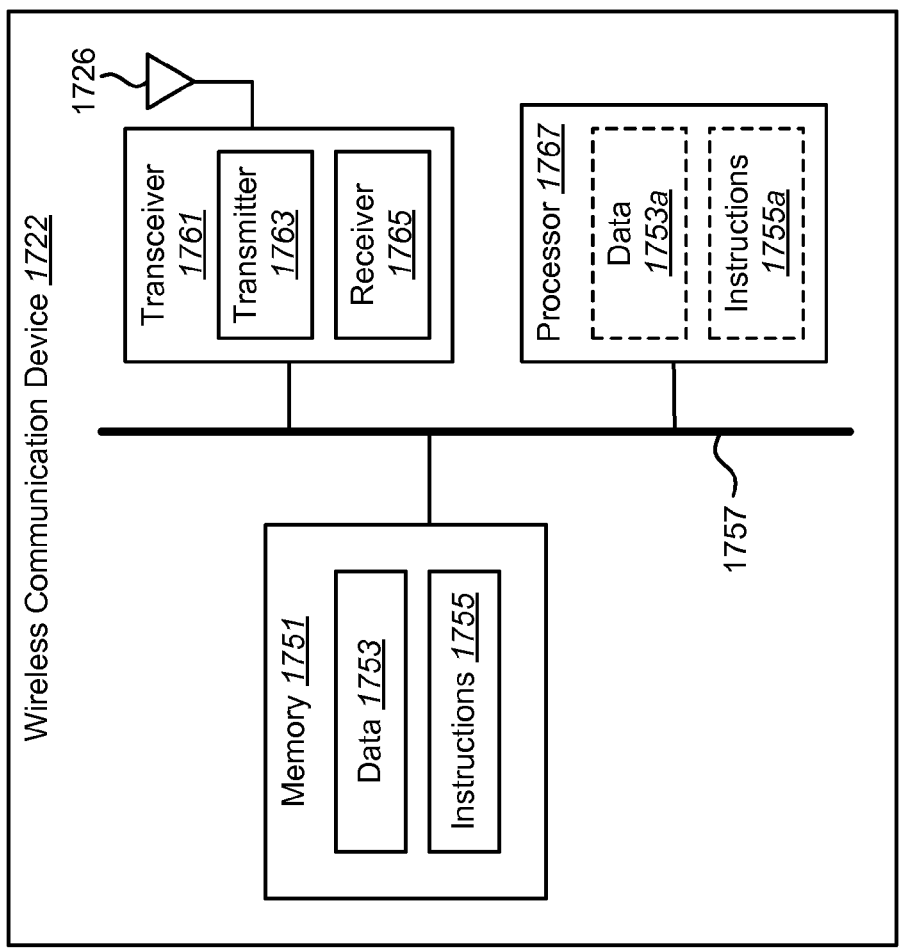
FIG. 17 illustrates certain components that may be included within a wireless communication device.

FIG. 17 illustrates certain components that may be included within a wireless communication device 1722. The wireless communication device 102 in FIG. 1 may be configured similarly to the wireless communication device 1722 that is shown in FIG. 17. Examples of wireless communication devices 1722 include cellular phones, handheld wireless devices, wireless modems, laptop computers, personal computers, etc.

The wireless communication device 1722 includes a processor 1767. The processor 1767 may be a general purpose single- or multi-chip microprocessor (e.g., an ARM), a special purpose microprocessor (e.g., a digital signal processor (DSP)), a microcontroller, a programmable gate array, etc. The processor 1767 may be referred to as a central processing unit (CPU). Although just a single processor 1767 is shown in the wireless communication device 1722 of FIG. 17, in an alternative configuration, a combination of processors (e.g., an ARM and DSP) could be used.

The wireless communication device 1722 also includes memory 1751 in electronic communication with the processor 1767 (i.e., the processor 1767 can read information from and/or write information to the memory 1751). The memory 1751 may be any electronic component capable of storing electronic information. The memory 1751 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers and so forth, including combinations thereof.

Data 1753 and instructions 1755 may be stored in the memory 1751. The instructions 1755 may include one or more programs, routines, sub-routines, functions, procedures, etc. The instructions 1755 may include a single computer-readable statement or many computer-readable statements. The instructions 1755 may be executable by the processor 1767 to implement the methods that were described above in connection with the access terminals 122. Executing the instructions 1755 may involve the use of the data 1753 that is stored in the memory 1751. FIG. 17 shows some instructions 1755*a* and data 1753*a* being loaded into the processor 1767.

The wireless communication device 1722 may also include a transmitter 1763 and a receiver 1765 to allow transmission and reception of signals between the wireless communication device 1722 and a remote location. The transmitter 1763 and receiver 1765 may be collectively referred to as a transceiver 1761. An antenna 1726 may be electrically coupled to the transceiver 1761. The wireless communication device 1722 may also include (not shown) multiple transmitters, multiple receivers, multiple transceivers and/or multiple antenna.

The various components of the wireless communication device 1722 may be coupled together by one or more buses, which may include a power bus, a control signal bus, a status signal bus, a data bus, etc. For simplicity, the various buses are illustrated in FIG. 17 as a bus system 1757.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The terms "computer-readable medium" or "computer-program product" refers to any available medium that can be accessed by a computer or computing device. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 5 and 12 can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for accessing extrinsic information in a turbo decoder, comprising:
   misaligning operation phases differently for Forward State Metric Calculators (FSMCs) and Reverse State Metric Calculators (RSMCs) in multiple maximum a posteriori probability (MAP) decoders based on whether a current half iteration is even or odd;
   reading first extrinsic information from a memory into the FSMCs and RSMCs using the misaligned operation phases;
   determining second extrinsic information using the MAP decoders; and
   storing each row of the second extrinsic information to a different bank of the memory using the misaligned operation phases.

2. The method of claim 1, wherein the reading comprises reading row by row if the current iteration is a sequential mode even half iteration.

3. The method of claim 2, wherein the reading comprises reading column by column if the current iteration is an interleaved mode odd half iteration.

4. The method of claim 3, wherein the reading comprises placing the first extrinsic information in a read queue before it is read by the Forward State Metric Calculators (FSMCs) and Reverse State Metric Calculators (RSMCs) and the storing comprises storing each row in a write queue before it is stored in the memory banks.

5. The method of claim 1, wherein the determining second extrinsic information comprises:
   determining a first forward state metric (FSM) for a first portion of the first extrinsic information, comprising:
      traversing the first portion of a received code block from left to right to determine a first FSM;
      determining a log-likelihood ratio based on the first FSM;
      determining two a priori probability (APP) values for the first FSM; and
   determining a first reverse state metric (RSM) for the first portion of the first extrinsic information, comprising:
      traversing the first portion of the received code block in reverse to determine the first RSM;
      determining a log-likelihood ratio based on the first RSM; and
      determining two APP values for the first RSM.

6. The method of claim 5, further comprising:
   determining a second forward state metric (FSM) for a second portion of the first extrinsic information;
   determining a second reverse state metric (RSM) for the second portion of the first extrinsic information;
   determining a third FSM for a third portion of the first extrinsic information;
   determining a third RSM for the third portion of the first extrinsic information;
   determining a fourth FSM for a fourth portion of the first extrinsic information; and
   determining a fourth RSM for the fourth portion of the first extrinsic information.

7. The method of claim 6, wherein if the current iteration is a sequential mode even half iteration, the misaligning comprises creating a first phase for the Forward State Metric Calculators (FSMCs) and a second phase for the Reverse State Metric Calculators (RSMCs).

8. The method of claim 6, wherein if the current iteration is an interleaved mode odd half iteration, the misaligning comprises creating a first phase for the first forward state metric (FSM), a second phase for the first reverse state metric (RSM), a third phase for the second FSM, a fourth phase for the second RSM, a fifth phase for the third FSM, a sixth phase for the third RSM, a seventh phase for the fourth FSM and an eighth phase for the fourth RSM.

9. The method of claim 1, wherein the turbo decoder is operating in a 3rd generation wireless network.

10. The method of claim 1, further comprising:
    dividing a code block into segments;
    if the current iteration is a sequential mode even half iteration:
       determining sequential addresses for memory access;
    if the current iteration is a first sequential mode even half iteration:
       determining intermediate boundary values for columns at boundaries of each segment;
       storing the intermediate boundary values in an array of registers; and
    if the current iteration is an interleaved mode odd half iteration:
       determining interleaved addresses based on intermediate values.

11. The method of claim 10, further comprising reading the second extrinsic information using the sequential addresses during sequential half iterations and reading the second extrinsic information using the interleaved addresses during interleaved half iterations.

12. An integrated circuit for accessing extrinsic information in a turbo decoder, comprising:
Forward State Metric Calculators (FSMCs) and Reverse State Metric Calculators (RSMCs) in multiple maximum a posteriori probability (MAP) decoders with misaligned operation phases based on whether a current half iteration is even or odd;
read queues configured to read first extrinsic information from a memory into the FSMCs and RSMCs using the misaligned operation phases;
MAP decoders configured to determine second extrinsic information; and
write queues configured to store each row of the second extrinsic information to a different bank of the memory using the misaligned operation phases.

13. The integrated circuit of claim 12, wherein if the current iteration is a sequential mode even half iteration, the read queues read the first extrinsic information row by row.

14. The integrated circuit of claim 13, wherein if the current iteration is an interleaved mode odd half iteration, the read queues read the first extrinsic information column by column.

15. The integrated circuit of claim 14, wherein the read queues are further configured to read the first extrinsic information before it is read by the Forward State Metric Calculators (FSMCs) and Reverse State Metric Calculators (RSMCs) and the write queues are further configured to store each row of the second extrinsic information before it is stored in the memory banks.

16. The integrated circuit of claim 12, wherein the MAP decoders are further configured to:
determine a first forward state metric (FSM) for a first portion of the first extrinsic information by:
traversing the first portion of a received code block from left to right to determine a first FSM;
determining a log-likelihood ratio based on the first FSM;
determining two a priori probability (APP) values for the first FSM; and
determine a first reverse state metric (RSM) for the first portion of the first extrinsic information by:
traversing the first portion of the received code block in reverse to determine the first RSM;
determining a log-likelihood ratio based on the first RSM; and
determining two APP values for the first RSM.

17. The integrated circuit of claim 16, wherein the maximum a posteriori probability (MAP) decoders are further configured to:
determine a second forward state metric (FSM) for a second portion of the first extrinsic information;
determine a second reverse state metric (RSM) for the second portion of the first extrinsic information;
determine a third FSM for a third portion of the first extrinsic information;
determine a third RSM for the third portion of the first extrinsic information;
determine a fourth FSM for a fourth portion of the first extrinsic information; and
determine a fourth RSM for the fourth portion of the first extrinsic information.

18. The integrated circuit of claim 17, wherein if the current iteration is a sequential mode even half iteration, the Forward State Metric Calculators (FSMCs) use a first operational phase and the Reverse State Metric Calculators (RSMCs) use a second operational phase.

19. The integrated circuit of claim 17, wherein if the current iteration is an interleaved mode odd half iteration, the first forward state metric (FSM) uses a first operational phase, the first reverse state metric (RSM) uses a second operational phase, the second FSM uses a third operational phase, the second RSM uses a fourth operational phase, the third FSM uses a fifth operational phase, the third RSM uses a sixth operational phase, the fourth FSM uses a seventh operational phase and the fourth RSM uses an eighth operational phase.

20. The integrated circuit of claim 12, wherein the turbo decoder is operating in a 3rd generation wireless network.

21. The integrated circuit of claim 12, further comprising an interleaver configured to:
divide a code block into segments;
if the current iteration is a sequential mode even half iteration:
determine sequential addresses for memory access;
if the current iteration is a first sequential mode even half iteration:
determine intermediate boundary values for columns at boundaries of each segment;
store the intermediate boundary values in an array of registers; and
if the current iteration is an interleaved mode odd half iteration:
determine interleaved addresses based on the intermediate values.

22. The integrated circuit of claim 21, wherein the read queues use sequential addresses to read the second extrinsic information during sequential half iterations and the read queues use the interleaved addresses to read the second extrinsic information during interleaved half iterations.

23. An apparatus for accessing extrinsic information in a turbo decoder, comprising:
a processor;
memory in electronic communication with the processor;
instructions stored in the memory, the instructions being executable by the processor to:
misalign operation phases differently for Forward State Metric Calculators (FSMCs) and Reverse State Metric Calculators (RSMCs) in multiple maximum a posteriori probability (MAP) decoders based on whether a current half iteration is even or odd;
read first extrinsic information from a memory into the FSMCs and RSMCs using the misaligned operation phases;
determine second extrinsic information using the MAP decoders; and
store each row of the second extrinsic information to a different bank of the memory using the misaligned operation phases.

24. The apparatus of claim 23, wherein the instructions are further executable to read the first extrinsic information row by row if the current iteration is a sequential mode even half iteration.

25. The apparatus of claim 24, wherein the instructions are further executable to read the first extrinsic information column by column if the current iteration is an iterative mode odd half iteration.

26. The apparatus of claim 25, wherein the instructions executable to read comprise instructions executable to place the first extrinsic information in a read queue before it is read by the Forward State Metric Calculators (FSMCs) and Reverse State Metric Calculators (RSMCs) and the instructions executable to store comprise instructions executable to store each row in a write queue before it is stored in the memory banks.

27. The apparatus of claim 23, wherein the instructions executable to determine second extrinsic information comprise instructions executable to:
  determine a first forward state metric (FSM) for a first portion of the first extrinsic information by:
    traversing the first portion of a received code block from left to right to determine a first FSM;
    determining a log-likelihood ratio based on the first FSM;
    determining two a priori probability (APP) values for the first FSM; and
  determine a first reverse state metric (RSM) for the first portion of the first extrinsic information, comprising:
    traversing the first portion of the received code block in reverse to determine the first RSM;
    determining a log-likelihood ratio based on the first RSM; and
    determining two APP values for the first RSM.

28. The apparatus of claim 27, further comprising instructions executable to:
  determine a second forward state metric (FSM) for a second portion of the first extrinsic information;
  determine a second reverse state metric (RSM) for the second portion of the first extrinsic information;
  determine a third FSM for a third portion of the first extrinsic information;
  determine a third RSM for the third portion of the first extrinsic information;
  determine a fourth FSM for a fourth portion of the first extrinsic information; and
  determine a fourth RSM for the fourth portion of the first extrinsic information.

29. The apparatus of claim 28, wherein the instructions executable to misalign are further executable to create a first phase for the Forward State Metric Calculators (FSMCs) and a second phase for the Reverse State Metric Calculators (RSMCs) if the current iteration is a sequential mode even half iteration.

30. The apparatus of claim 28, wherein the instructions executable to misalign are further executable to create a first phase for the first forward state metric (FSM), a second phase for the first reverse state metric (RSM), a third phase for the second FSM, a fourth phase for the second RSM, a fifth phase for the third FSM, a sixth phase for the third RSM, a seventh phase for the fourth FSM and an eighth phase for the fourth RSM if the current iteration is an interleaved mode odd half iteration.

31. The apparatus of claim 23, wherein the apparatus is operating in a 3rd generation wireless network.

32. The apparatus of claim 23, further comprising instructions executable to:
  divide a code block into segments;
  if the current iteration is a sequential mode even half iteration:
    determine sequential addresses for memory access;
  if the current iteration is a sequential mode even half iteration:
    determine intermediate boundary values for columns at boundaries of each segment;
    store the intermediate boundary values in an array of registers; and
  if the current iteration is an interleaved mode odd half iteration:
    determine interleaved addresses based on the intermediate values.

33. The apparatus of claim 32, further comprising instructions executable to read the second extrinsic information during sequential half iterations using the sequential addresses and to read the second extrinsic information during interleaved half iterations using the interleaved addresses.

34. An apparatus for accessing extrinsic information in a turbo decoder, comprising:
  means for misaligning operation phases differently for Forward State Metric Calculators (FSMCs) and Reverse State Metric Calculators (RSMCs) in multiple maximum a posteriori probability (MAP) decoders based on whether a current half iteration is even or odd;
  means for reading first extrinsic information from a memory into the FSMCs and RSMCs using the misaligned operation phases;
  means for determining second extrinsic information using the MAP decoders; and
  means for storing each row of the second extrinsic information to a different bank of the memory using the misaligned operation phases.

35. The apparatus of claim 34, wherein the means for reading reads the first extrinsic information row by row if the current iteration is a sequential mode even half iteration.

36. The apparatus of claim 35, wherein the means for reading reads the first extrinsic information column by column if the current iteration is an interleaved mode odd half iteration.

37. The apparatus of claim 36, wherein the means for reading comprises means for placing the first extrinsic information in a read queue before it is read by the Forward State Metric Calculators (FSMCs) and Reverse State Metric Calculators (RSMCs) and the means for storing comprises means for storing each row in a write queue before it is stored in the memory banks.

38. The apparatus of claim 34, wherein the means for determining second extrinsic information comprises:
  means for determining a first forward state metric (FSM) for a first portion of the first extrinsic information, comprising:
    means for traversing the first portion of a received code block from left to right to determine a first FSM;
    means for determining a log-likelihood ratio based on the first FSM;
    means for determining two a priori probability (APP) values for the first FSM; and
  means for determining a first reverse state metric (RSM) for the first portion of the first extrinsic information, comprising:
    means for traversing the first portion of the received code block in reverse to determine the first RSM;
    means for determining a log-likelihood ratio based on the first RSM; and
    means for determining two APP values for the first RSM.

39. The apparatus of claim 38, further comprising:
  means for determining a second forward state metric (FSM) for a second portion of the first extrinsic information;
  means for determining a second reverse state metric (RSM) for the second portion of the first extrinsic information;
  means for determining a third FSM for a third portion of the first extrinsic information;
  means for determining a third RSM for the third portion of the first extrinsic information;

means for determining a fourth FSM for a fourth portion of the first extrinsic information; and means for determining a fourth RSM for the fourth portion of the first extrinsic information.

40. The apparatus of claim 39, wherein the means for misaligning comprises means for creating a first phase for the Forward State Metric Calculators (FSMCs) and a second phase for the Reverse State Metric Calculators (RSMCs) if the current iteration is a sequential mode even half iteration.

41. The apparatus of claim 39, wherein the means for misaligning comprises means for creating a first phase for the first forward state metric (FSM), a second phase for the first reverse state metric (RSM), a third phase for the second FSM, a fourth phase for the second RSM, a fifth phase for the third FSM, a sixth phase for the third RSM, a seventh phase for the fourth FSM and an eighth phase for the fourth RSM if the current iteration is an interleaved mode odd half iteration.

42. The apparatus of claim 34, wherein the apparatus is operating in a 3rd generation wireless network.

43. The apparatus of claim 34, further comprising:
means for dividing a code block into segments;
if the current iteration is a sequential mode even half iteration:
  means for determining sequential addresses for memory access;
if the current iteration is a sequential mode even half iteration:
  means for determining intermediate boundary values for columns at boundaries of each segment;
  means for storing the intermediate boundary values in an array of registers; and
if the current iteration is an interleaved mode odd half iteration:
  means for determining interleaved addresses based on the intermediate values.

44. The apparatus of claim 43, further comprising means for reading the second extrinsic information using the sequential addresses during sequential half iterations and means for reading the second extrinsic information using the interleaved addresses during interleaved half iterations.

45. A computer-program product for accessing extrinsic information in a turbo decoder, the computer-program product comprising a non-transitory computer-readable medium having instructions thereon, the instructions comprising:
  code for causing a computing device to misalign operation phases differently for Forward State Metric Calculators (FSMCs) and Reverse State Metric Calculators (RSMCs) in multiple maximum a posteriori probability (MAP) decoders based on whether a current half iteration is even or odd;
  code for causing a computing device to read first extrinsic information from a memory into the FSMCs and RSMCs using the misaligned operation phases;
  code for causing a computing device to determine second extrinsic information using the MAP decoders; and
  code for causing a computing device to store each row of the second extrinsic information to a different bank of the memory using the misaligned operation phases.

46. The computer-program product of claim 45, wherein the code for causing a computing device to read comprises code for causing a computing device to read row by row if the current iteration is a sequential mode even half iteration.

47. The computer-program product of claim 46, wherein the code for causing a computing device to read comprises code for causing a computing device to read column by column if the current iteration is an interleaved mode odd half iteration.

48. The computer-program product of claim 47, wherein the code for causing a computing device to read comprises code for causing a computing device to place the first extrinsic information in a read queue before it is read by the Forward State Metric Calculators (FSMCs) and Reverse State Metric Calculators (RSMCs) and the code for causing a computing device to store comprises code for causing a computing device to store each row in a write queue before it is stored in the memory banks.

\* \* \* \* \*